United States Patent [19]

Tsang et al.

[11] Patent Number: 5,648,283

[45] Date of Patent: Jul. 15, 1997

[54] HIGH DENSITY POWER DEVICE FABRICATION PROCESS USING UNDERCUT OXIDE SIDEWALLS

[75] Inventors: Dah Wen Tsang; Dumitru Sdrulla; Douglas A. Pike, Jr., all of Bend, Oreg.; Theodore O. Meyer, Austin, Tex.; John W. Mosier, II, deceased, late of Bend, Oreg., by Molly P. Mosier, executrix

[73] Assignee: Advanced Power Technology, Inc., Bend, Oreg.

[21] Appl. No.: 190,325

[22] Filed: Jan. 31, 1994

Related U.S. Application Data

[63] Continuation-in-part of Ser. No. 927,169, Aug. 7, 1992, Pat. No. 5,283,201.

[51] Int. Cl.[6] .......................... H01L 21/265; H01L 49/00
[52] U.S. Cl. ............................. 437/40; 437/203; 437/31; 437/6
[58] Field of Search ...................... 437/40 DM, 41 DM, 437/203, 31, 6; 257/329, 330, 331, 332, 333, 334

[56] References Cited

U.S. PATENT DOCUMENTS

| | | | |
|---|---|---|---|
| 4,070,690 | 1/1978 | Wickstrom . | |
| 4,145,703 | 3/1979 | Blanchard et al. . | |
| 4,325,073 | 4/1982 | Hughes et al. | 437/40 |
| 4,587,712 | 5/1986 | Baliga | 437/6 |
| 4,656,076 | 4/1987 | Vetanen et al. | 437/41 |
| 4,713,358 | 12/1987 | Bulat et al. | 437/6 |
| 4,967,245 | 10/1990 | Cogan et al. | 437/203 |
| 4,994,871 | 2/1991 | Chang et al. . | |
| 5,019,522 | 5/1991 | Meyer et al. | 437/40 |
| 5,089,434 | 2/1992 | Hollinger | 437/41 |
| 5,108,937 | 4/1992 | Tsai et al. | 437/40 |

(List continued on next page.)

FOREIGN PATENT DOCUMENTS

| | | |
|---|---|---|
| 41 11046 | 10/1991 | Germany . |
| 1-198076 | 8/1989 | Japan . |
| 3-109775 A | 5/1991 | Japan . |

OTHER PUBLICATIONS

Baba, Y., et al, "A Study on a High Blocking Voltage UMOS-FET With a Double Gate Structure," Proceedings of 1992 International Symposium on Power Semiconductor Devices & ICs, Institute of Electrical Engineers of Japan and IEEE Electron Devices Society, Tokyo, Japan, pp. 300–302.

(List continued on next page.)

Primary Examiner—John Niebling
Assistant Examiner—Brian K. Dutton
Attorney, Agent, or Firm—Marger, Johnson, McCollom & Stolowitz, P.C.

[57] ABSTRACT

A gate power MOSFET on substrate (20) has a P-body layer (26), N-drain layer (24) and optional P+ layer (22) for IGBT. Layer (430) on surface (28) patterns areas (446) as stripes or a matrix, and protected areas. Undercut sidewalls (444) of thickness (452), with protruding rims (447), contact the sides of layer (434'). Trench (450) in areas (446) has silicon sidewalls aligned to oxide sidewall (447) and extending depthwise through P-body layer (26) to depth (456). Gate oxide (460) is formed on the trench walls and gate polysilicon (462) refills trench (450) to a level (464) near surface (28) demarcated by the undercut sidewall rims (447). Oxide (468) between spacers (444) covers polysilicon (462). Removing layer (430) exposes surface (28') between the sidewalls (444). Source layer (72) is doped atop the body layer (26') and then trenched to form trench (80) having sidewalls aligned to inner side faces of sidewalls (444). Trench (80) defines vertically-oriented source and body layers (86, 90) stacked along oxide layer (460) to form vertical channels on opposite sides of trench (80). Layers (86, 90) have a lateral thickness (88) of the undercut sidewalls (444) and rims (447) spacers. Conductor (94) contacts the N-source and P-body layers, and enhanced P+ region in trench (80).

34 Claims, 16 Drawing Sheets

U.S. PATENT DOCUMENTS

| | | | |
|---|---|---|---|
| 5,177,572 | 1/1993 | Markamai | 257/330 |
| 5,260,227 | 11/1993 | Farb et al. | 437/203 |
| 5,270,257 | 12/1993 | Shin | 437/203 |
| 5,283,201 | 2/1994 | Tsang et al. | 437/31 |
| 5,378,655 | 1/1995 | Hutchings et al. | 437/203 |
| 5,405,794 | 4/1995 | Kim | 437/41 DM |
| 5,430,315 | 7/1995 | Rumennik | 257/331 |

OTHER PUBLICATIONS

D. Ueda, H. Takagi, and G. Kano, "A New Vertical Power MOSFET Structure with Extremely Reduced On–Resistance", IEEE Trans. Electron Dev. ED–32, No. 1, pp. 2–6, Jan. 1985.

D. Ueda, H. Takagi, and G. Kano, "Deep–Trench Power MOSFET with An Ron Area Product of 160 m$\Omega$–mm$^2$," IEEE IEDM Tech. Digest, pp. 638–641, 1986.

H.R. Chang, R.D. Black, V.A.K. Temple, W. Tantraporn and B.J. Baliga, "Ultra Low Specific On–Resistance UMOS FET," IEEE IEDM, pp. 642–645, 1986.

D. Ueda, H. Tagaki, and G. Kano, "An Ultra–Low On–Resistance Power MOSFET Fabricated by Using a Fully Self–Aligned Process," IEEE Trans. Electron Dev. ED–34, No. 4, pp. 926–930, Apr. 1987.

H. R. Chang, R. D. Black, V. A. K. Temple, W. Tantraporn, and B. J. Baliga, "Self–Aligned UMOSFET's with a Specific On–Resistance of 1 m$\Omega$–cm$^2$," IEEE Trans. Electron Dev. ED–34, No. 11, pp. 2329–2334, Nov. 1987.

H. R. Chang, B. J. Baliga, J.W. Kretchmer, and P.A. Piacente, "Insulated Gate Bipolar Transistor (IGBT) with a Trench Gate Structure," IEEE IEDM Tech. Digest, pp. 674–677, 1987.

S. Mukherjee, M. Kim, L. Tsou, and M. Simpson, "TDMOS—An Ultra–Low On–Resistance Power Transistor," IEEE Trans. Electron Dev. ED–35, No. 12, p. 2459, Dec. 1988.

C. Bulucea, M. R. Kump, and K. Amberiadis, "Field Distribution and Avalanche Breakdown of Trench MOS Capacitor Operated in Deep Depletion," IEEE Trans. Electron Dev. ED–36, No. 11, pp. 2521–2529, Nov. 1989.

K. Shenai, "Optimally Scaled Low–Voltage Vertical Power MOSFET's for High–Frequency Power Conversation," IEEE Trans. Electron Dev. vol. 37, No. 4, Apr. 1990.

K. Shenai, W. Hennessy, M. Ghezzo, D. Korman, H. Chang, V. Temple, and M. Adler, "Optimum Low–Voltage Silicon Power Switches Fabricated Using Scaled Trench MOS Technologies," IEEE IEDM Tech. Digest pp. 793–797, 1991.

K. Shenai, "A 55–V, 0.2–m$\Omega$–cm$^2$ Vertical Trench Power MOSFET," IEEE Electron Dev. Lett. EDL–12, No. 3, pp. 108–110, Mar. 1991.

S. Matsumoto, T. Ohno, K. Izumi, "Ultralow Specific on Resistance Umosfet with Trench Contacts for Source and Body Regions Realised By Selfaligned Process," Electronics Letters, vol. 27, No. 18, pp. 1640–1641, Aug. 29, 1991.

Chang, Insulated Gate Bipolar Transistor (IGBT) with a Trench Gate Structure, IEDM Tech. Digest, 1987, pp. 674–677.

Shenai, Optimum Low–Voltage Silicon Power Switches Fabricated Using Scaled Trench MOS Technologies, IEDM Tech. Digest, 1991, pp. 793–797.

Shenai, A 55–V, 0.2–m$\Omega$–cm$^2$ Vertical Trench Power MOSFET, Electron Dev. Lett., EDL–12, No. 3, Mar. 1991, pp. 108–110.

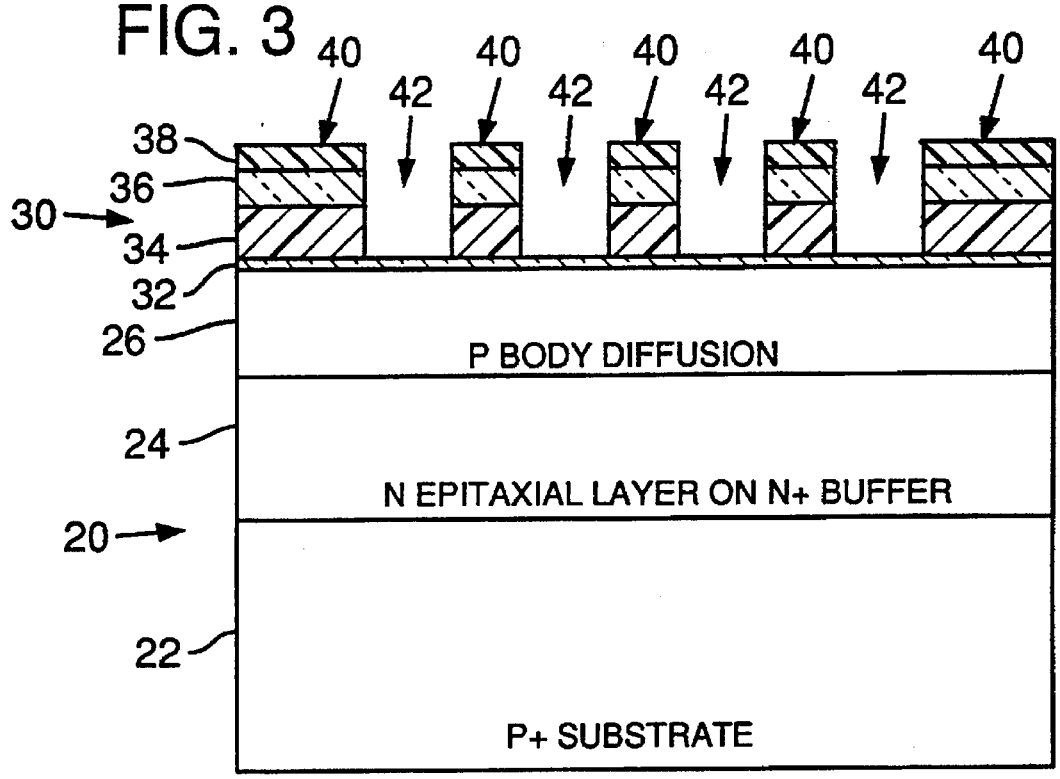
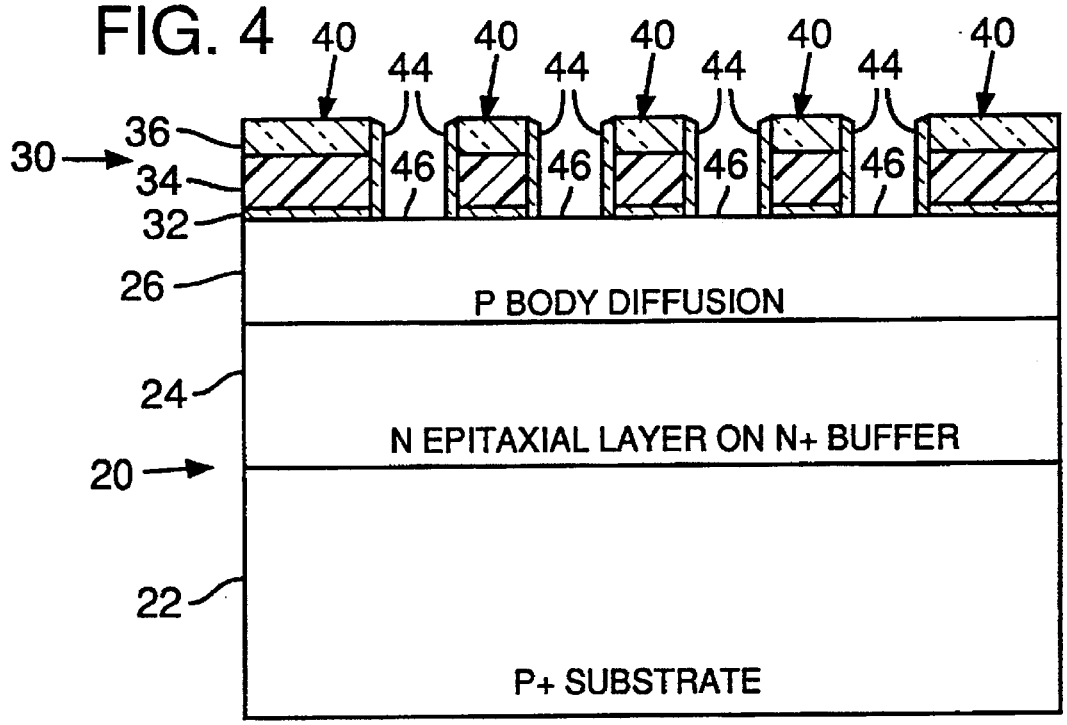

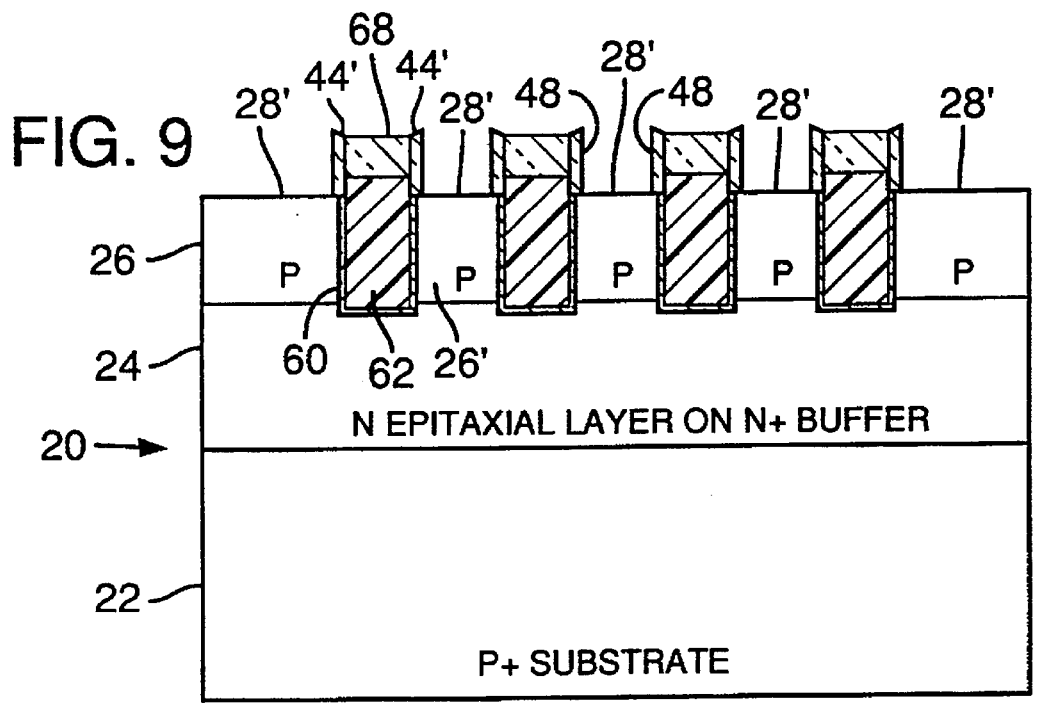
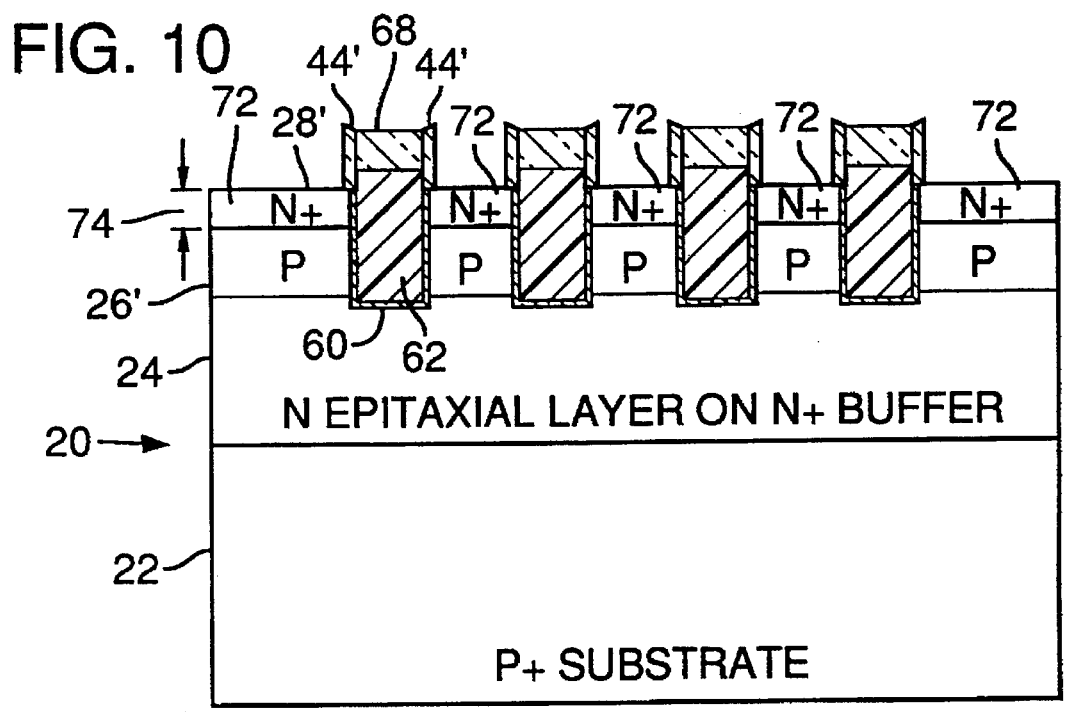

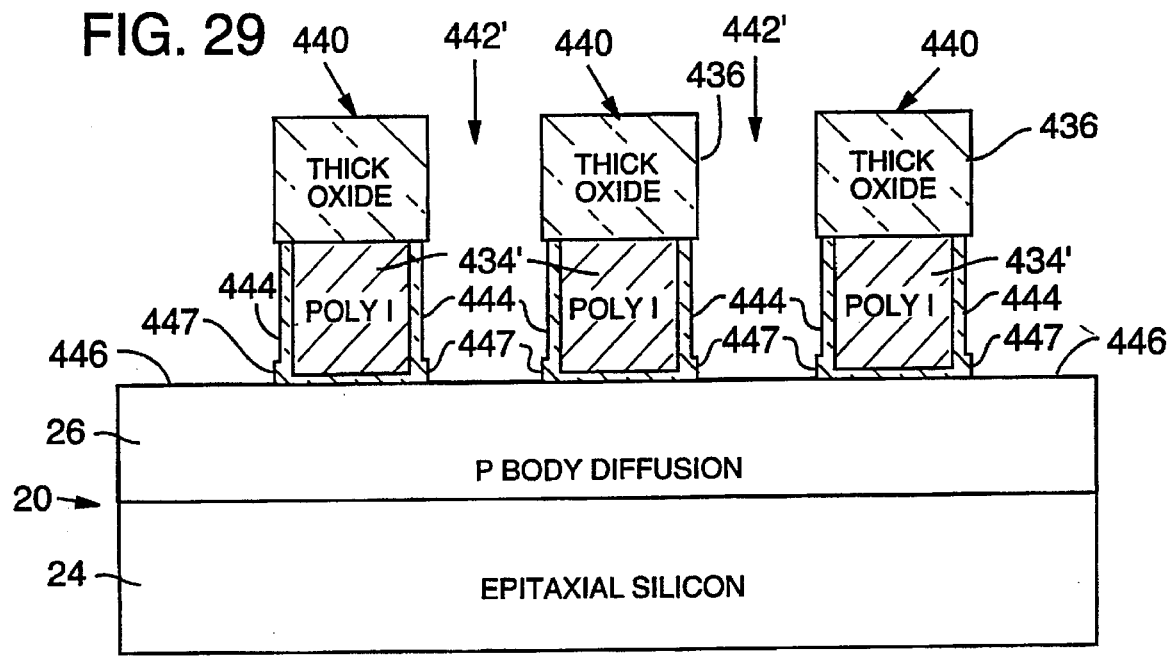
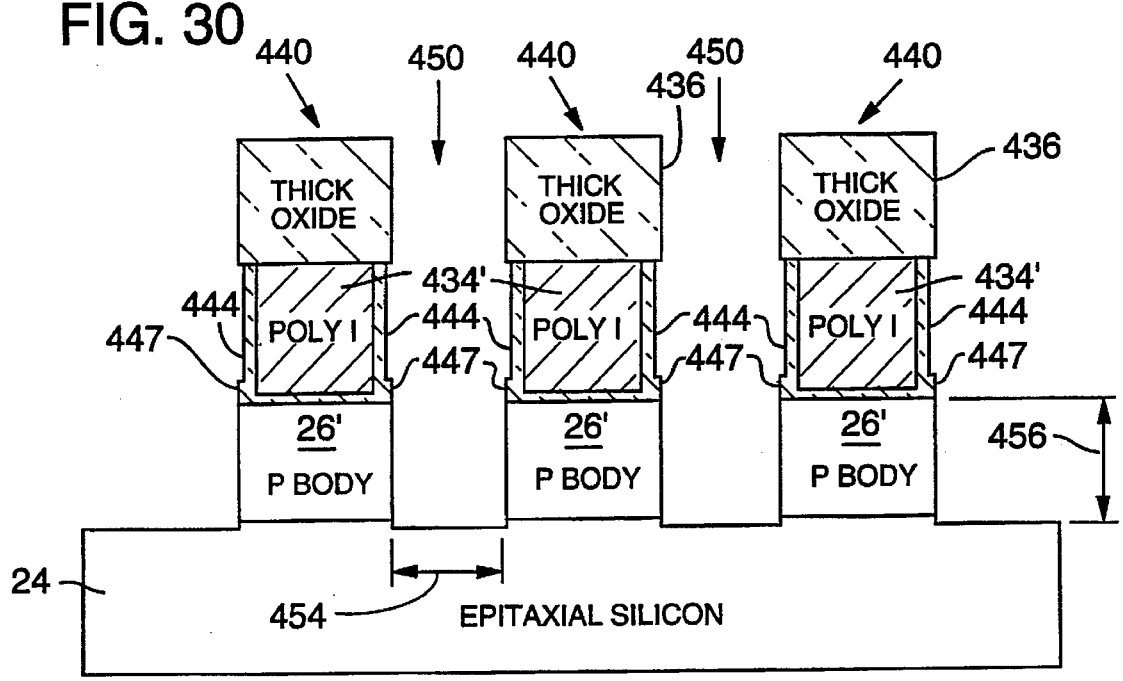

HIGH DENSITY POWER DEVICE FABRICATION PROCESS USING UNDERCUT OXIDE SIDEWALLS

RELATED APPLICATION DATA

This application is a continuation-in-part of commonly assigned application Ser. No. 07/927,169, filed Aug. 7, 1992, now U.S. Pat. No. 5,283,201, issued Feb. 1, 1994.

BACKGROUND OF INVENTION

This invention relates generally to power MOS field-effect devices, which includes power MOSFETs, insulated gate bipolar transistors (IGBT), MOS controlled thyristors and the like, and more particularly to recessed gate, rectangular-grooved or U-grooved power MOS field effect devices, commonly referred to as RMOSFETs or UMOSFETs.

Power MOSFETs have been recognized as provided a number of advantages over power bipolar transistors, particularly in regard to fast switching response, high input impedance and high thermal stability. A major disadvantage of power MOSFETs is their large ON-resistance and forward voltage drop compared to bipolar transistors. Significant efforts have gone into reducing the ON-resistance per unit area. These efforts include reducing the cell size of the devices to increase cell density, but the ability to do this in conventional VDMOS devices is limited by the presence of a parasitic junction FET between adjacent cells which increases ON-resistance as the device structure is scaled to smaller cell sizes. K. Shenai, "Optimally Scaled Low-Voltage Vertical Power MOSFET's for High Frequency Power Conversion," *IEEE Trans. On Electron Devices*, Vol. 37, No. 2, April, 1990 describes how the VDMOS device structure, having the gate and channel extending horizontally along the top surface of the semiconductor substrate, is inherently limited in density, necessitating other measures to reduce ON-resistance.

To avoid this inherent limitation, another class of power MOS field-effect devices has been developed using a recessed gate, in which the gate and channel are formed vertically along a sidewall of a channel or trench etched in the semiconductor substrate. These devices include rectangular-grooved or U-grooved power MOS field effect devices, commonly referred to as RMOSFETs or UMOSFETs. An early device of this type appears in U.S. Pat. No. 4,070,690 to Wickstrom. The source, channel and drain are formed by successive layers deposited on a substrate and trenched through for gate oxide formation and gate metal deposition on sidewalls of the trench. A variation of this approach, called the VMOS, is shown in U.S. Pat. No. 4,145,703 to Blanchard et al. Subsequently, it was recognized that the vertical channel orientation in this type of device could be scaled down to increase cell density without parasitic junction FET effects and thereby reduce ON-resistance below the inherent limitations of VDMOS devices. (See D. Ueda et al., "A New Vertical Power MOSFET Structure with Extremely Reduced On-Resistance," *IEEE Trans. on Electron Devices*, Vol. 32, No. 1, January, 1985) Further development of recessed gate technology is summarized below based on references listed at the end of the detailed description.

The usual starting material is a N+ wafer with a <100> oriented N epitaxial layer of a resistivity and thickness in the ranges of 0.1–1.0 ohm-cm and 5–10 μm for low voltage MOSFETs to achieve a breakdown voltage of 15–55 V using rectangular striped grooves. This voltage range can be changed by adjusting untrenched P-base width, trench depth and width, and epi-layer doping. The N+ substrate can be replaced by a P+ substrate to make IGBTs as in DMOS technology.

A blanket P-type implant into the top surface of the epitaxial layer is diffused to 1.5–2.0 μm depth to form a P-type body region. A first mask can be used at this stage to define N+ source regions.

An oxide layer is thermally grown and a trenching protective layer of silicon nitride (or LPCVD oxide, polysilicon/silicon nitride/oxide or other layer resistant to Si etching) is deposited to protect P-body/N-source regions from trenching.

Regions to be trenched are exposed during photomasking, at right angles to the source regions if they have been defined previously, and the trenching protective layer is defined. Reactive ion etching (RIE) is then used to form the gate trenches, typically to a depth of 2 μm but variable as discussed below. Reactive ion etching can damage the substrate surface, causing high surface charge and low surface mobility. Chemical etching and sacrificial oxidation/etching steps are typically performed to restore surface mobility and channel conductance.

Gate oxide of 500–2000 Å is regrown in the trench, and ~6000 Å thick polysilicon is deposited in the trench and doped to a sheet resistance of about 20 ohm/□. A second polysilicon layer is deposited to planarize the surface and etched back to open the trenching protective layer. The trenching protective layer can be used in a self-aligned LOCOS (LOcalized Oxidation of Silicon) step to selectively oxidize and isolate the polysilicon gate structures from the P-body/N-source regions. The maximum LOCOS film thickness is limited by minimum linewidth because of "birds beak" sidewall oxidation encroachment. With a 2 μm/2 μm minimum gate/source design rule, this layer cannot be much greater than 1 μm thick or the source region will be completely sealed off by LOCOS encroachment. The LOCOS process further induces stress immediately surrounding the selective oxidation zone, wherein the MOS channel is formed, reducing surface mobility and increasing channel resistance.

If the source region has not already been defined, another photomasking step is performed to introduce the N-type source regions into the P-body contact regions, usually with a striped geometry perpendicular to the trench sidewalls, to effect distinctive P and N dopings at the top surface of the silicon, to short the P-body to the N+ source regions (10). This technique produces pinched P-base regions which are of wide dimensions, typically 2 μm or more, and must be meticulously controlled in the photolithographic process. This step causes loss of channel width wherever N+ source is absent and reduces device ruggedness.

In one approach (2, 5, 10-FIG. 10), to improve packing density and more tightly control the lateral extent of the pinched B-base and avoid photolithographic control, lateral N+ diffusions are made from the windows formed in the trenching protective layer prior to trenching. In this approach, the P and N+ diffusions are fully diffused before gate oxidation, without partitioning the respective diffusion times to allow part of the diffusion cycles to be used for annealing RIE- and LOCOS-induced surface stress and defects. Also in this approach, contacts are made on lighter doped N+ diffusions, increasing series resistance of the device. A tradeoff is required between pinched base resistance and source contact resistance. There is a lower limit to how small the lateral diffusions can be made and consistently opened up after the LOCOS gate polysilicon oxidation due to "birds beak" formation. A dimension anywhere between 50% and 80% of the polysilicon LOCOS oxide thickness may not be available for a source contact of highest doping.

Another approach is to form a second trench through the N-source layer down to the P-body to receive source metal. This trench can be patterned by a separate photomasking step (1) but this approach is subject to critical alignment and size conditions. A self-aligned approach (11) depends on the ability to control both formation of the LOCOS oxide layer used to self-align this trenching step and to control the etching process itself. As noted above, "birds beak" formation can seal off the area to be trenched.

Once the basic recessed gate structure is formed, gate vias are opened to allow metal connections to the gate electrode in a self-aligned process. Frontside metal is deposited and patterned to delineate the gate and source (cathode) electrodes. Passivation deposition and pad patterning seal the device surface and open up the bonding pads. The backside of the silicon wafer is metallized to form the drain (anode) electrode.

Ueda et al have demonstrated that the lowest ON-resistance ($R_{ON}$) is achievable in a device in which the gate is trenched all the way through the N-epitaxial layer to the substrate (2). Unfortunately this approach also demonstrates a monotonic decrease in breakdown voltage as trench depth is increased. This decrease is due to reduction of the epi-layer thickness below the trench and higher electric field at the corners of the trench (7). Another problem with the deep trench is that the gate oxide might rupture at the corner of the trench because of high field intensity (7). The breakdown voltage is generally divided between gate oxides and depleted silicon. As trench depth is increased, the thickness of silicon under the trench is reduced, shifting more of the gate-drain voltage to the gate oxide and increasing the likelihood that the oxide layer will rupture. Thickening the gate oxide will improve the gate rupture resistance of the oxide layer but also increases channel resistance.

Accordingly, a need remains for a better fabrication method and structure for a vertical channel field effect MOS power device.

SUMMARY OF INVENTION

One object of the invention is to avoid the uncertainties and difficulties of photolithography and LOCOS layer formation in forming the functional areas of recessed gate field effect power MOS device.

Another object is to facilitate P-body and N-source shorting without having to trade off series source resistance against vertical channel resistance in a recessed gate field effect power MOS device.

A further object of the invention is to avoid LOCOS induced stress in silicon to increase the yield of functional recessed gate field effect power MOS devices.

The invention is a recessed gate field effect power MOS device structure and fabrication process which are improved in several aspects.

One aspect is the use of a sidewall spacer on the trenching protective layer in a self-aligned process to control lateral extent of the pinched P-base width. Improved ruggedness of the device and an effective doubling of channel width over prior art are achieved. The sidewall spacer is formed by deposition and etching to define the spacer width, thus avoiding the uncertainties and difficulties of photolithography and LOCOS layer formation in defining the N+ source region. The sidewall spacer guides the etching in a first trenching step, to define the initial width of separate body regions.

Another aspect of the invention is that the trenching protective layer is formed by using an oxide (or oxynitride) layer on a polysilicon layer on thin thermal oxide, instead of silicon nitride on oxide. No LOCOS step is needed in this method. The top oxide layer provides selective protection against silicon trench etching and polysilicon gate etching, preferably by $SF_6$—$O_2$ plasma etching. In one embodiment, the oxide layer is preferably ~5000 Å thick but can be 2000–8000 Å thick depending on trench depth, gate polysilicon thickness and the etch rate selectivity between silicon and oxide. The 5000 Å oxide film is sufficient to block 2–5 μm of silicon trenching plus additional margin for gate polysilicon etching. The polysilicon layer in this embodiment is preferably 1000–3000 Å thick and is used to protect the future source region, to support the sidewall spacers, and to enable the deposition and complete isolation of gate polysilicon. The lower oxide layer is preferably ~500 Å thick (range of 500 to 1000 Å thick) and serves as an etch stop under the polysilicon layer.

A second embodiment uses a polysilicon layer preferably formed in a double layer with an intermediate etch-stop oxide layer below a sacrificial top polysilicon layer. In this embodiment, the lower polysilicon layer is thicker (e.g., 15000–16000 Å), the intermediate etch-stop oxide layer is thinner (e.g., 1000–2000 Å) and is covered by an upper polysilicon layer of about 5000 Å.

A further aspect of the invention is the introduction of a second trench in the body region to create source contacts on the trench sidewalls and body contacts on the trench sidewalls and bottom wall. Doing this with sidewall spacers provides self-alignment without the drawbacks of LOCOS formation. This approach thus produces a field effect power MOS device with a recessed source as well as a recessed gate. This structure is highly advantageous in switching inductive loads as it will shunt substantial reverse currents directly to the source contacts, which are preferably metal conductors. This structure also provide a very low resistance short between the body and source (base and emitter) to prevent reverse biasing of the body/source junction and minimize potential for latching of the parasitic NPN bipolar transistor formed by the source, body and drain regions. This is particularly advantageous if the device is fabricated on a P-type substrate to make an IGBT or other MOS gate-controlled four-layer device.

A variation of the second embodiment uses a thicker intermediate oxide layer (range: 1000–20000 Å; e.g., 5000–16000 Å) and upper polysilicon layer (range: 5000–16000 Å). The processing steps roughly parallel those of the basic process summarized above but, instead of explicitly forming a sidewall spacer, utilize a novel undercut and sidewall oxidation procedure to form self-aligning sidewalls prior to the introduction of the second trench. In general, the undercut and oxide sidewall serve the same purpose as the sidewall spacer in defining the initial width of the body region. An advantage of this approach, however, is that it provides a distinct rim along each side of the trench at the base of the lower polysilicon layer, i.e., slightly above the upper surface of the body layer, giving the overall protective layer an I-beam cross-sectional shape. This rim serves to visibly demarcate the level at which to stop etching back the gate polysilicon material that is refilled into the first trench.

Whether the explicit sidewall spacers or the undercut oxide sidewalls are used, the outer edge of the rim or the outer face of the sidewall spacer equally serve to define a predetermined spacing from the inner faces thereof. This spacing serves, in subsequent steps of etching the first and second trenches, to establish the lateral thickness of the vertically-oriented source and body regions of the vertical MOSFET device.

The foregoing and other objects, features and advantages of the invention will become more readily apparent from the following detailed description of a preferred embodiment which proceeds with reference to the accompanying drawings.

BRIEF DESCRIPTION OF DRAWINGS

FIGS. 1–12 are cross-sectional views of a portion of a silicon substrate showing fabrication of a recessed gate field effect power MOS device in accordance with a first embodiment of the invention.

FIGS. 26–32 are cross-sectional views corresponding roughly to FIGS. 3–7 showing an alternative embodiment of the process commencing with the substrate and mask surrogate layer structure of FIG. 25.

DETAILED DESCRIPTION

Figure 1:
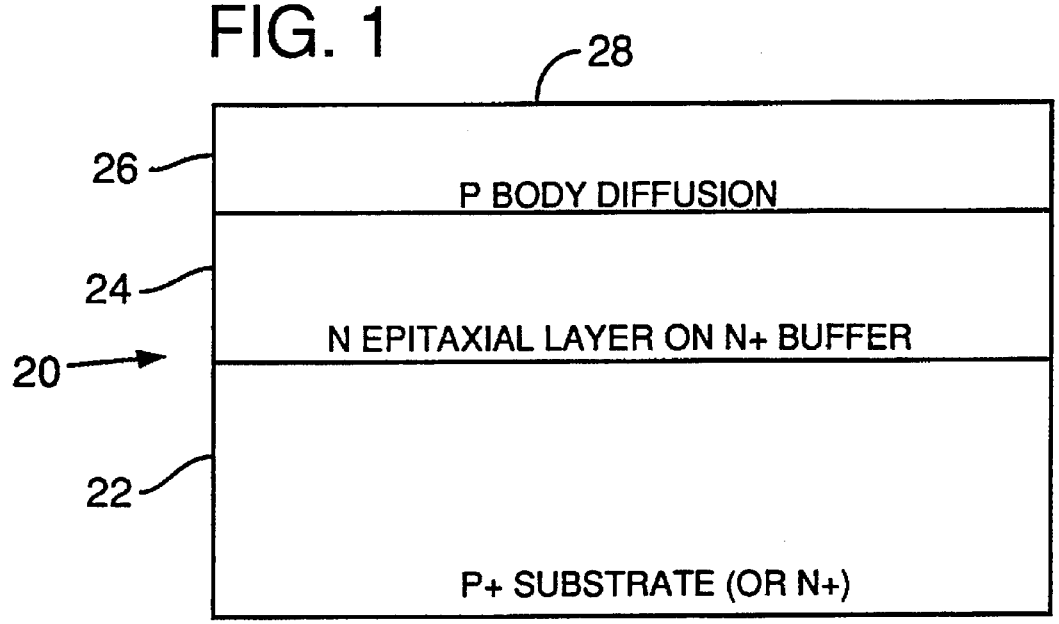

FIG. 1 is a cross-sectional view of a portion of a silicon substrate 20 on which beginning doped layers including body and drain regions have been formed to begin fabrication of a recessed gate field effect power MOS device in accordance with a first embodiment of the invention. The process starts by forming a <100> oriented N-type epitaxial layer 24 on a P+ wafer 22. This substrate will be used to make an IGBT-type four-layer device. An N+ wafer can be substituted to make a three-layer power MOSFET. Then, a P-type body layer 26 is formed either by implantation (e.g., boron) and diffusion to a 2–3 μm depth into the N-epitaxial layer or by deposition of a 2–3 μm P-epitaxial layer atop the N-epitaxial layer. The N-type epitaxial layer is doped to a concentration of about $10^{16}$ cm$^{-3}$ (resistivity in the range of 0.1 to 1.0 Ω-cm) and has a thickness of 2 to 3 μm and the P-epitaxial layer is doped to a concentration of about $10^{17}$ cm$^{-3}$ and has a thickness of 2 to 3 μm for low voltage (e.g., 60 V) MOSFETs. The N-type epitaxial layer 24 includes an N+ buffer layer at the interface with the P-type substrate, as is known. For higher voltage devices, layers 24, 26 are generally more lightly doped and thicker, as described in U.S. Ser. No. 07/852,932, filed Mar. 13, 1992, now U.S. Pat. No. 5,262,336. For example, N-type layer 24 has a doping concentration of about $10^{14}$ cm$^{-3}$ and a thickness of 85 μm and P-type layer 26 has a doping concentration of about $5 \times 10^{16}$ cm$^{-3}$ for 1000 V devices). Voltages can also be adjusted by varying the untrenched P-base width, trench depth and width, and epitaxial doping concentration.

Figure 2:
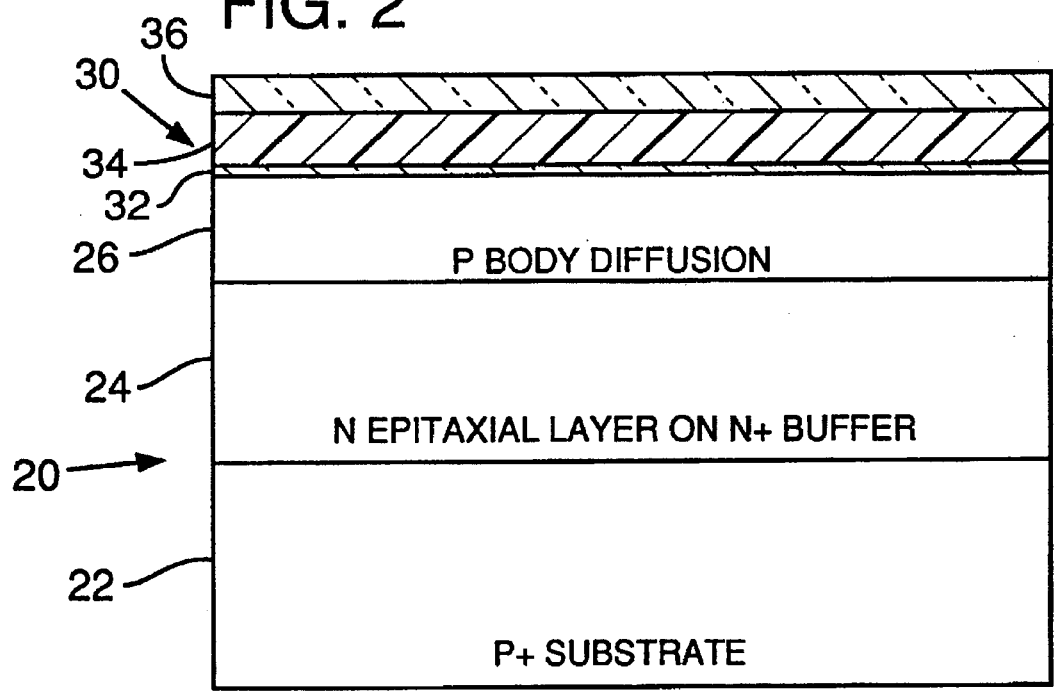
Figure 24:
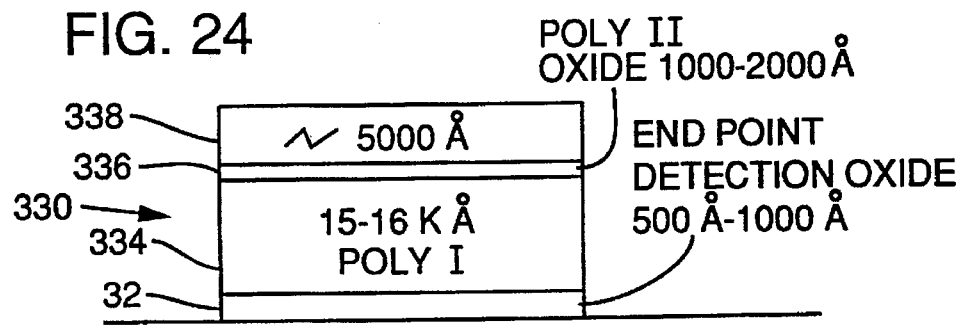
FIG. 24 is a cross-sectional view corresponding to FIG. 3 showing an alternative form of the mask surrogate pattern definition layer.

FIG. 2 shows the further steps of forming a trenching protective or mask surrogate pattern definition layer 30 on the upper surface 28 of substrate 20. As shown in FIG. 2, layer 30 is a thin oxide/PolySi/thick oxide tri-layer structure. FIG. 24 shows an alternative four-layer structure further described below. Layer 30 is formed by a thin thermal oxide layer 32 on surface 28, a PECVD polysilicon layer 34, and a LPCVD thick oxide layer 36. The top oxide layer 36 provides selective protection against silicon trench etching and polysilicon gate etching, preferably by SF$_6$—O$_2$ plasma etching. In one embodiment, oxide layer 36 is preferably ~5000 Å thick but can be 1000–8000 Å thick depending on trench depth, gate polysilicon thickness and the etch rate selectivity between silicon and oxide. The 5000 Å oxide film is sufficient to block 2–5 μm of silicon trenching plus additional margin for gate polysilicon etching. The polysilicon layer 34 in this embodiment is preferably 1000–3000 Å thick and is used to protect the future source region, to support the sidewall spacers, and to enable the deposition and complete isolation of gate polysilicon. The lower oxide layer 32 is preferably ~1000 Å thick (range of 500–2000 Å thick) and serves as an etch stop under the polysilicon layer.

FIG. 3 shows the steps of masking and patterning the trenching protective layer. A photoresist layer 38 is applied over layer 30 and is patterned to define protected regions 40 and etched away regions 42 in layer 30 in successive etching steps of layers 36 and 34. Regions 42 and 40 can be stripes, a rectangular or hexagonal matrix, or other geometries of design. In a cellular design, regions 40 are discrete blocks or islands separated by interconnecting regions 42.

FIG. 4 shows the removal of photoresist layer 38 and formation of sidewall spacers 44 along opposite vertical sides of the pattern-defining tri-layer regions 40. The sidewall spacers 44 are formed using known procedures by a conformal LPCVD oxide layer, preferably of 0.5–1 μm thickness, which is reactive ion etched anisotropically. The spacer etch is controlled to end when substrate silicon is exposed in areas 46 of silicon substrate exposed between the sidewall spacers 44 within regions 42 so that the top oxide layer 36 is only slightly eroded. The spacers have a laterally exposed or outer face 47 and an inner face 48 contacting the sides of the pattern-defining regions 40 at this stage in the process.

Figure 5:
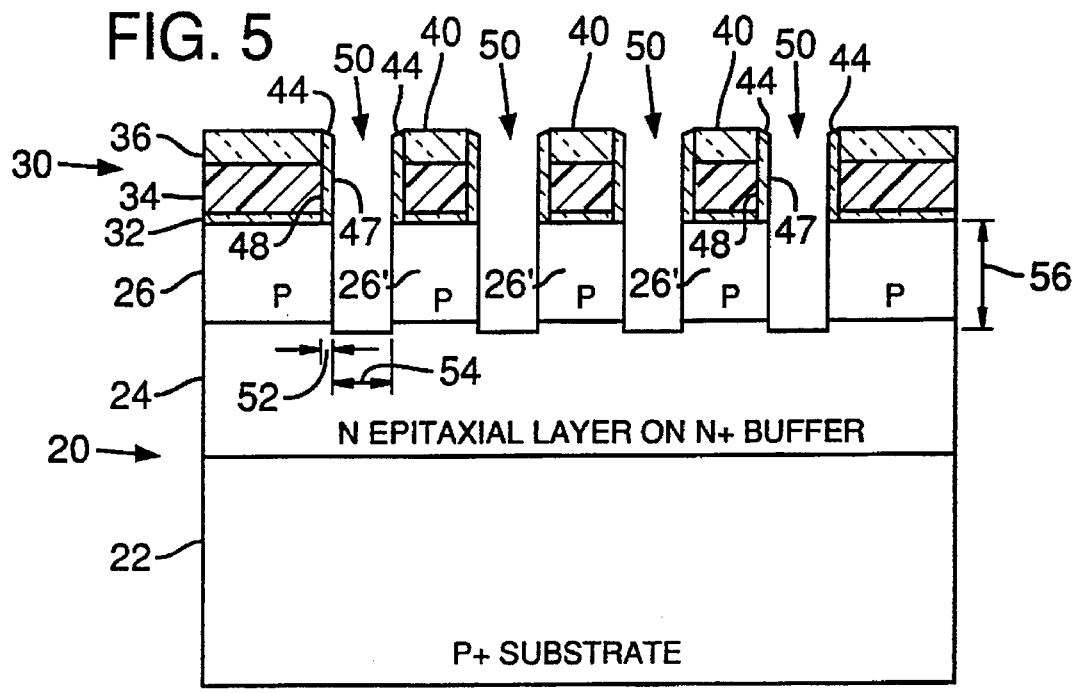

FIG. 5 shows forming a trench 50 in the silicon substrate in each of the exposed areas 46. This first anisotropic etching step is accomplished by reactive-ion etching, preferably by SF$_6$—O$_2$ plasma etching as described in commonly-assigned U.S. Pat. No. 4,895,810 (see FIG. 13E), controlled to form a series of spaced trenches 50 in the substrate 20 with minimal damage to the silicon surface and straight vertical sides aligned with the outer faces 47 of the sidewall spacers. The spacing between the outer faces 47 of spacers 44 determines the width 54 of the trench 50 as a function of lateral thickness 52 of the spacers. Thickness 52 also partially determines the eventual lateral thickness of the source regions as formed in FIG. 11. In this embodiment, the depth 56 of the trench is sufficient (e.g., 2 μm) to penetrate through the P-type layer 26 just into an upper portion of the N-type layer 24. This step laterally isolates regions 26' of the P-type layer covered by the pattern-defining tri-layer regions 40. Regions 64 can be stripes in an interdigitated design or connecting network in a cellular design.

Figure 6:
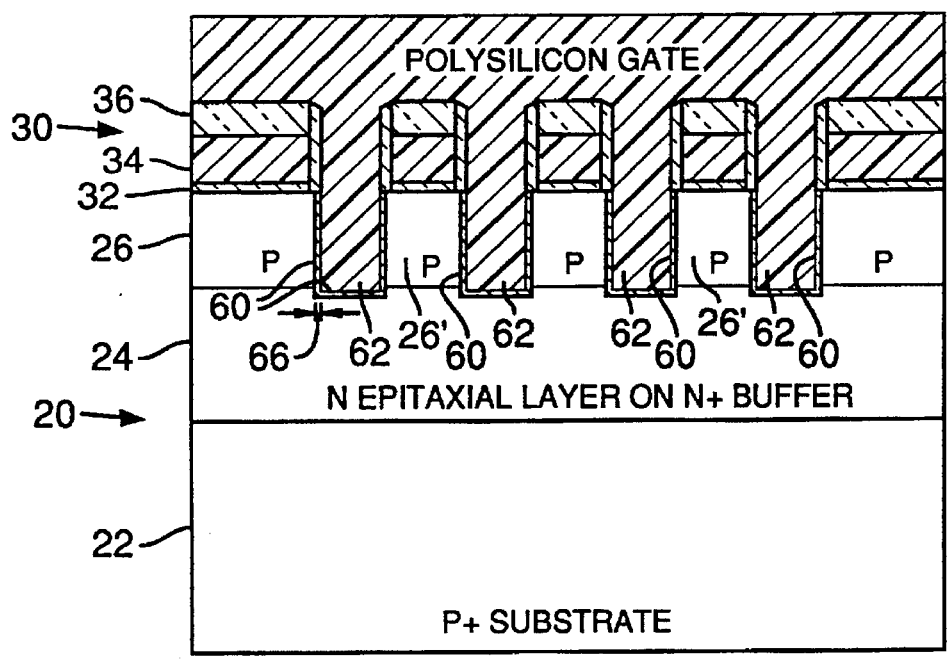

Following trenching, a thermal gate oxide layer 60 is grown, as shown in FIG. 6, on the trench side and bottom walls below the sidewall spacers. The gate oxide layer has a thickness 66 that is selected as needed to provide a punchthrough resistant gate dielectric, e.g., ~500 Å. Then, the trench is refilled with LPCVD polysilicon gate material 62, extending into the trenches 50 and over trenching protective structures 40. The polysilicon gate material 62 is doped to about 20 Ω/□.

Figure 7:
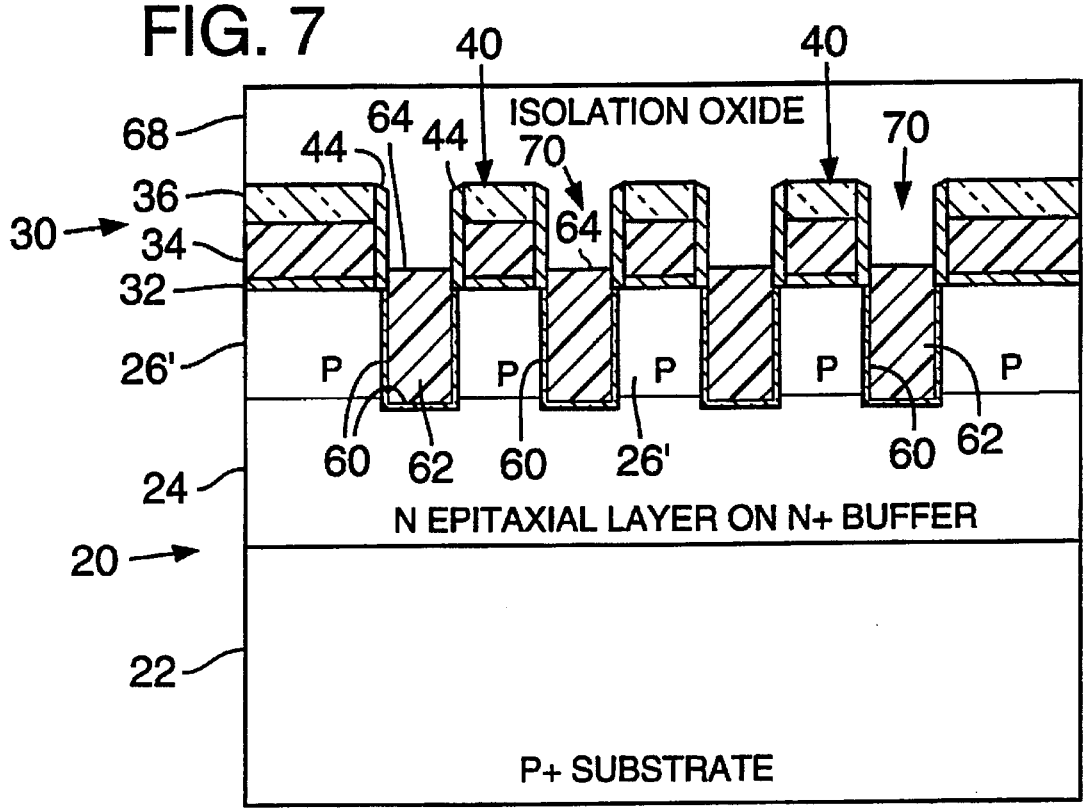

Referring to FIG. 7, a second anisotropic etch is next used to etch the polysilicon material 62 back to about the level of the original substrate surface, again exposing the trenching protective structures. This step leaves vertical trenches 70 between the sidewall spacers 44 like trenches 50 but ending at the upper surface 64 of the remaining polysilicon material 62. A silicide can be formed in the remaining polysilicon material at this step to further reduce gate resistance, for example, by refractory metal deposition and silicide formation. Then, a CVD oxide (or oxynitride) isolation layer 68 is deposited into the trenches 50 over the remaining polysilicon material 64 and over the trenching protective structures 40.

Figure 8:
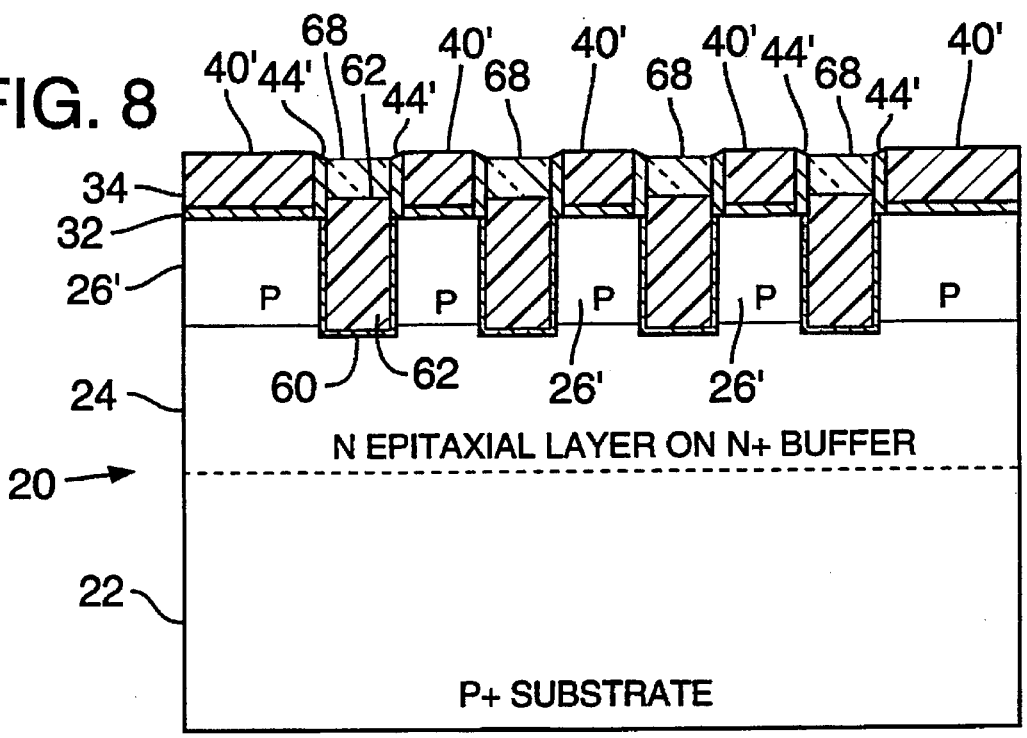
Figure 13:
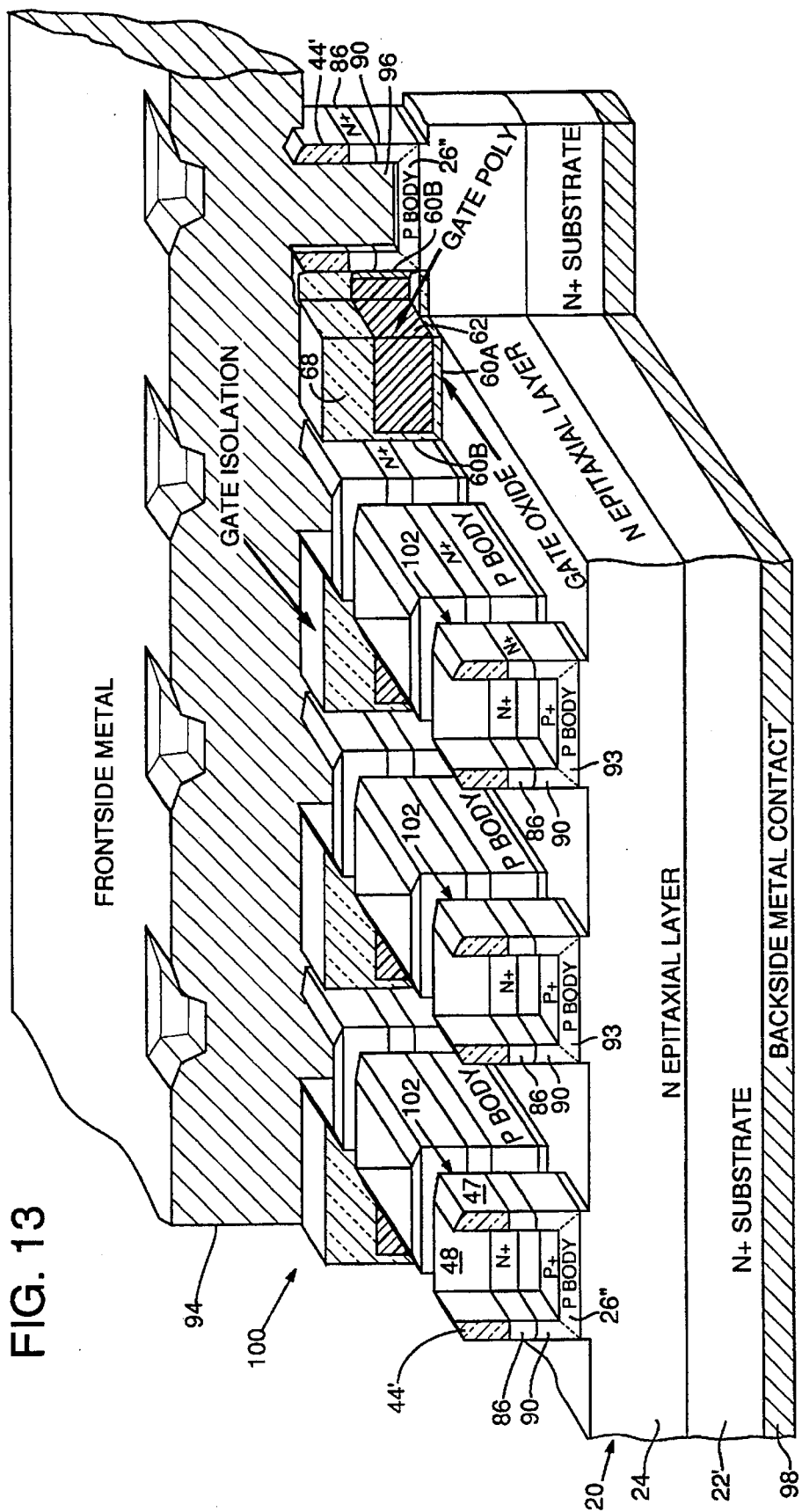
FIG. 13 is a perspective view of a device made by the process of FIGS. 1–12.

FIG. 8 shows the device after anisotropically etching off the upper portion of the isolation oxide 68 and the upper thick oxide layer 36 of the trenching protective layer 30. The etch stops when the top surface 40' of the original polysilicon layer is exposed, leaving oxide plugs 68 atop the surface 64 of polysilicon material 62 between shortened sidewall spacers 44'. At this stage, the top surface of the intermediate device appears in plan view as a series of alternating oxide and polysilicon stripes 68, 40', or as an interconnected region 68 with isolated regions 40' as shown in FIG. 13.

FIG. 9 shows the further steps of etching away the original polysilicon layer 34 followed by etching away the thin lower oxide layer 32 of the trenching protective layer 30 to expose the original substrate surface 28, which now appears as stripes 28' or isolated zones, exposed between the sidewall spacers 44' which now appear on opposite sides of oxide plugs 68.

FIG. 10 shows diffusing N+ source regions 72 into an upper layer of exposed stripes of the substrate just beneath the original substrate surface 28'. This is preferably done by shallowly implanting a dose of about $5\times10^{15}\text{cm}^{-2}$ of arsenic or phosphorus atoms, and heat treating to activate the implant. The resulting source region 72 should be diffused to a depth 74 of about 1 μm or slightly less. This step could be performed alternatively by gaseous diffusion. It could also be performed earlier in the process, e.g., after forming the P-type body layer in FIG. 1. The above-described sequence and method are preferred, however, as giving more control over MOSFET channel length as further described below.

Figure 11:
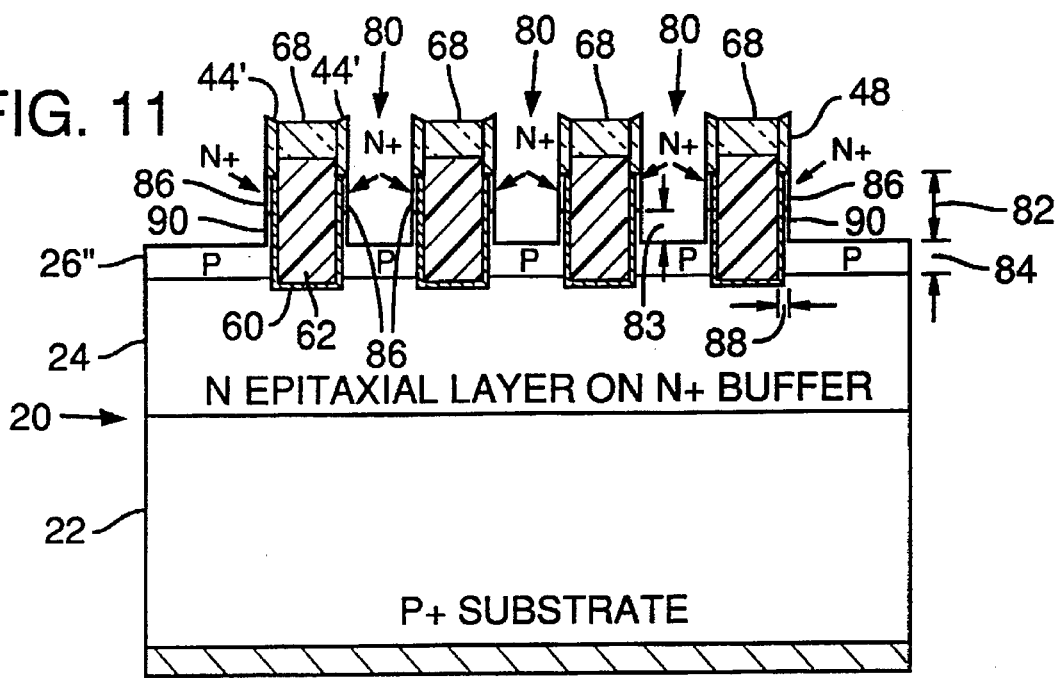

Next, referring to FIG. 11, a second anisotropic etch of the substrate silicon is performed to form a second trench 80 in the substrate material between the sidewalls 44' and gate isolation oxide plugs 68 enclosing the gate polysilicon material 62 and gate oxide layers 60. The etching technique used is preferably by $SF_6$—$O_2$ plasma etching, as noted above, to form the trenches with straight vertical sides aligned with the now exposed inner faces 48 of the sidewall spacers. The trench depth 82 is at least 1 μm so as to penetrate at least through the N+ diffusion and a portion of the P layer 26 but less than original thickness of layer 26 so that a P+ layer with thickness 84 of about 1 μm remains at the base of trench 80. As a result of this step, the N+ region is reduced to vertically oriented N+ source layers 86 having a lateral thickness 88 that is approximately equal to the difference between the thickness 52 of the sidewall spacers (see FIG. 5) and about half of the thickness 66 of the gate oxide layer (see FIG. 6). For a sidewall spacer thickness 52 of about 1 μm and a gate oxide thickness of ~500 Å, the N+ layer has a lateral thickness of ≤1 μm, e.g. ~9750 Å. For a sidewall spacer thickness 52 of about 0.5 μm and a gate oxide thickness of ~500 Å, the N+ layer has a lateral thickness of ≤0.5 μm, e.g. ~4750 Å.

The N+ source layers 86 each sit atop a thin vertically-oriented layer 90 of P substrate material, which provides the active body region in which a vertical channel of the MOSFET device is formed when the gate is suitably biased. This channel exists on all sides of the gate structure. The depth 74 of the N+ implant (FIG. 10) and the depth of the P diffusion 26 determine the ultimate vertical MOSFET channel length of the device. A typical channel length of about 1-2 μm is produced using the dimension disclosed herein, but can readily be altered as needed to define the MOSFET device switching characteristics. The overall vertical height 84 of the P layer must be sufficient to avoid punchthrough, suitably 1-2 μm at the P doping concentrations provided herein. The lateral thickness of the P layer 90 provides a very short lateral pinched P-base controlled by sidewall spacer thickness. If the sidewalls of the trench are strictly vertical, the active body region 90 has a similar lateral thickness to that of the N+ layer, ~5000 Å. In practice, the body region 90 lateral thickness can vary slightly from that of the N+ layer. The key point is that lateral thickness of both layers 86, 90 can be controlled by controlling the lateral thickness of either the gate oxide layer 60 or the sidewall spacers 44, or both. Another key point is, that by using this method the pinched base can be made much narrower than in conventional lateral channel VDMOS devices, which typically have a pinched base width of 3-4 μm.

Optionally albeit preferably, a second, shallow P-type implant and anneal can be performed at this stage to provide an enhanced P+ conduction region 93 (see FIG. 13) in the remaining P-type layer 26" at the base of the trench 80, as described in U.S. Pat. No. 4,895,810 (see FIGS. 13D and 14). This can further improve source metal contact to the P-body and reduce pinched-base resistance in a totally self-aligned manner without materially affecting threshold doping of the active channel region that remains in layer 90 after forming the gate oxide layer 60.

Figure 12:
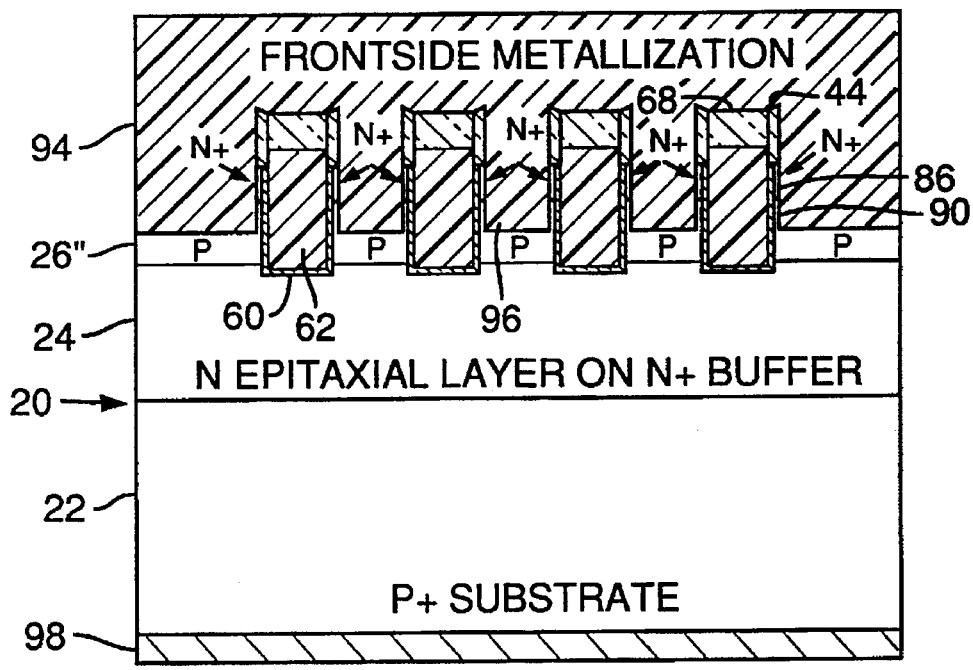

The remainder of the process generally follows prior art methods and so is only generally described. FIG. 12 is a cross-sectional view showing frontside and backside metallization 94, 98. The frontside metal 94 extends downward into the trenches 80 to form conductive source contacts or fingers 96 which vertically short the source and body layers 86, 90 together as well as contact the top surface of the remaining P-type layer 26" at the bottom of the trench. The backside metal 98 forms the drain contact or cathode. The completion steps also include opening gate contact vias at discrete locations, which can be done in this process without critical alignment, and passivating the surface.

The foregoing method has several advantages over prior art methods. The N and P-type contact areas are created without a mask. The channel area is increased. The pinched P-body width lateral width is reduced. The overall device has a higher packing density from savings of surface area due to formation of the source contacts on the trench sidewalls. The device has lower resistance due to higher surface mobility resulting from the low stress process.

FIG. 13 is a perspective and partially-sectioned view of a device 100 made by the process of FIGS. 1–12 but using an N+ wafer 22' to make a three-layer power MOSFET rather than a four-layer device. Having already described the method of fabrication in detail, the resulting device is only described generally, using the same reference numerals wherever applicable. In this perspective view, the isolated source and P-body structures are confined within discrete islands separated by an interconnecting crisscross pattern or matrix gate structure. Other array arrangements, such as arranging the source blocks in a hexagonal geometry, can be done as well. A cellular design with isolated source islands surrounded by a gate mesh in a trench can significantly reduce gate resistance, an important factor in very large area devices. The result is a castellated structure of rectangular device cells 102, each receiving a downward protruding finger 96 of source metal, and separated from one another by a contiguous matrix of recessed gate structure 60, 62, 68 as shown in FIG. 13.

The device 100 has a silicon substrate 20 including a silicon wafer 22 (P+ as in FIGS. 1–12) or 22' (N+ in FIG. 13) with, successively, an N-type epitaxial layer 24 forming a drain or drift region and a P-type layer 26" forming a body or base region. The P-type region includes castellated vertical P-type layers 90 in which the active channels are formed. Atop the vertical P-type layers 90 are vertically aligned vertical N-type layers 86 which form the source regions of the MOSFET device. Atop the vertical N-type layers 86 are vertically aligned spacers 44' which serve together with oxide plugs 68 in the final device to isolate the source metal 94 from the gate polysilicon 62. The gate polysilicon material 62 is isolated vertically from upper surface of substrate layer 24 by a horizontal portion 60A of gate oxide layer 60 extending beneath the gate polysilicon and laterally from the vertically aligned vertical N-type and P-type layers 86, 90 by a vertical portion 60B of gate oxide layer 60.

FIGS. 14–20 show a second embodiment of the invention in which a recessed gate field effect power MOSFET device is fabricated with a gate structure, formed by a double polysilicon structure separated by oxide, which terminates depthwise in substrate 120 within an N+ wafer layer 122. The purpose of this modification is to achieve the lowest possible on-resistance in a power MOSFET without losing voltage blocking capacity. This modification to the process uses the same steps as shown in FIGS. 1–4 with an N+ substrate 122 and the same features are identified with the same reference numerals. Except as stated below, the process details are like those described above in the first embodiment.

Figure 14:
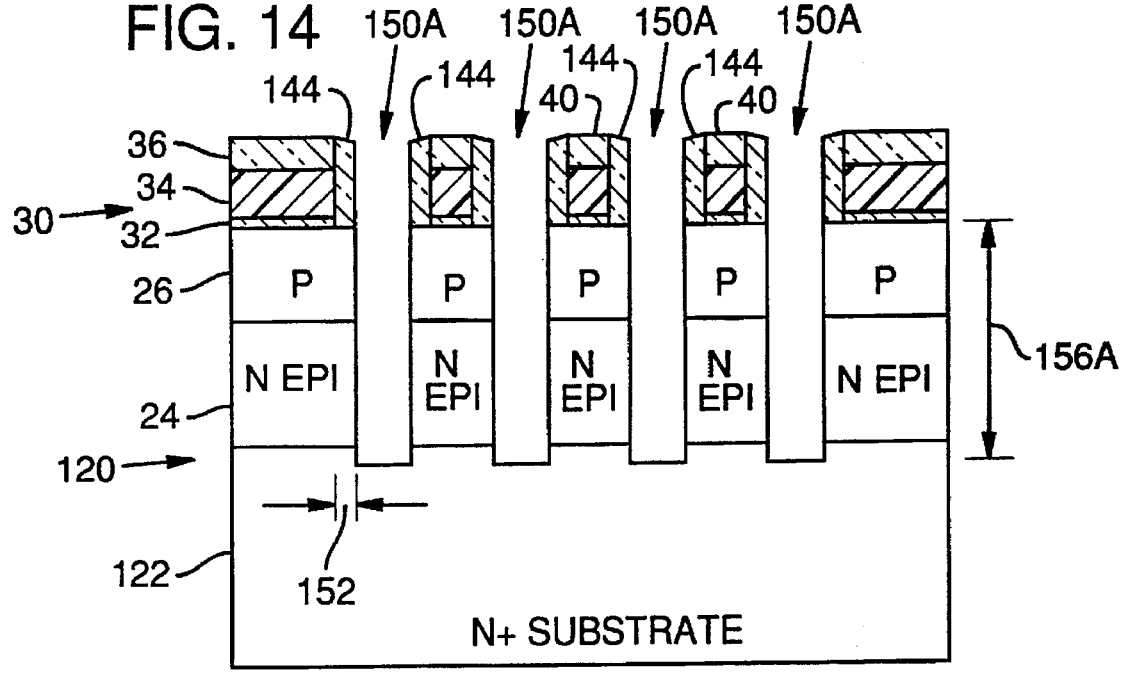
FIGS. 14–20 are cross-sectional views corresponding roughly to FIGS. 5–12 showing fabrication of a recessed gate field effect power MOS device in accordance with a second embodiment of the invention with a double polysilicon gate structure which terminates depthwise within the N+ substrate.

FIG. 14 is a cross-sectional view corresponding to FIG. 5 except that the sidewall spacers 144 have a greater thickness 152, e.g., 0.8 to 1.0 µm vs. ≦0.5 µm for the first embodiment, or are made of oxynitride or other silicon-etch resistant material to tolerate longer etching, and the trenches 150A between the sidewall spacers are anisotropically etched to a depth 156A (e.g., 5–6 µm for a 60 V device) through the epitaxial layer 24 to the N+ silicon wafer layer 122.

Figure 15:
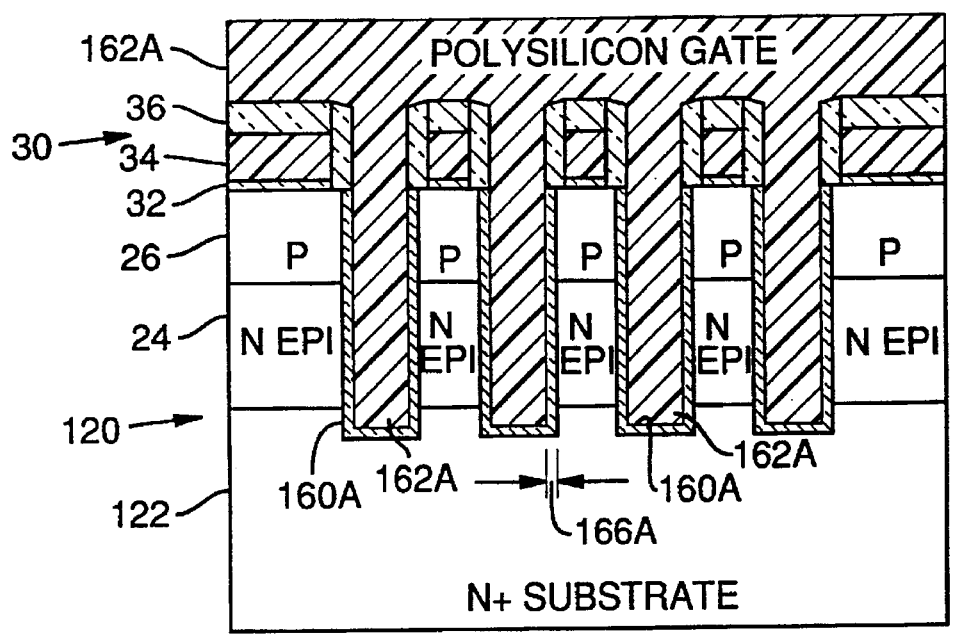

FIG. 15 corresponds to FIG. 6 and shows the formation of a thick oxide layer 160A on the deep trench surfaces and a deep LPCVD polysilicon filler 162A into the trenches 150A and over the trenching protective structures 30. The oxide layer 160A in this example has a thickness 166A of 2000 to 3000 Å. This first gate polysilicon layer 162A can but need not be doped.

Figure 16:
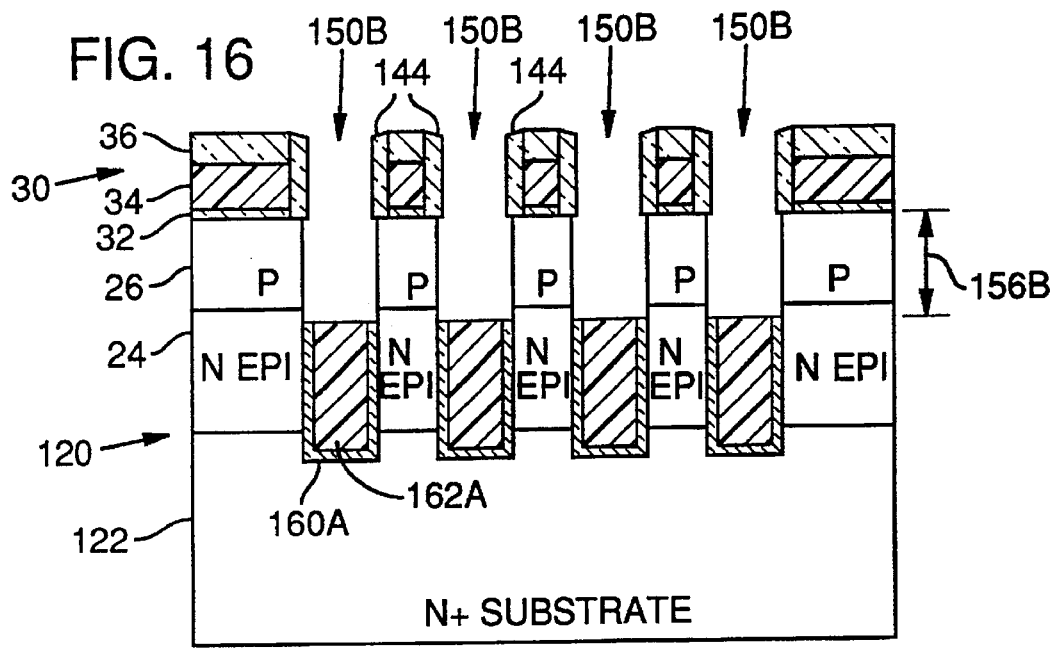

FIG. 16 shows the further steps of etching the polysilicon layer 162A and thick oxide layer 160A downward to a level slightly below the P-body region 26, as indicated by arrow 156B. What remains is a shallower trench 150B with a depth 156B comparable to depth 56 of trench 50 in FIG. 5. The polysilicon layer 162A is anisotropically etched to a level slightly below the final P-body junction depth, giving a trench 150B of depth 156B above the first polysilicon layer 162A approximately equal to the thickness of the P-body. The thick oxide is then etched off the sidewalls of the trench 150B wherever it is not protected by the remaining polysilicon 162A.

Figure 17:
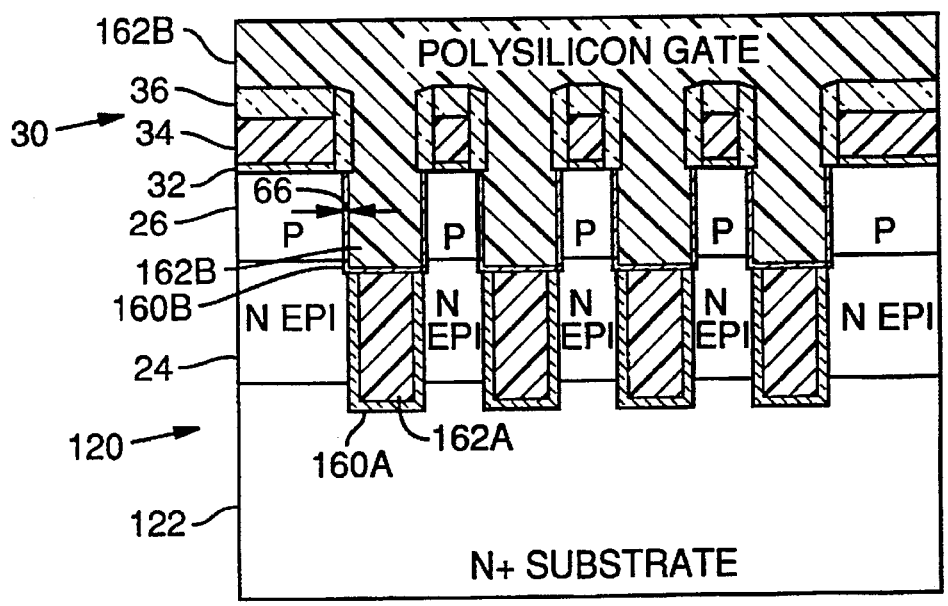

Next, as shown in FIG. 17, a thin gate oxide layer 160B is thermally regrown on the reduced depth trench sidewalls and the upper surface of the deep polysilicon filler to a thickness 66 as in the first embodiment. Then, doped gate polysilicon 162B is deposited into the trenches 150B atop oxide layer 160B and over trenching protective structures 30.

Figure 18:
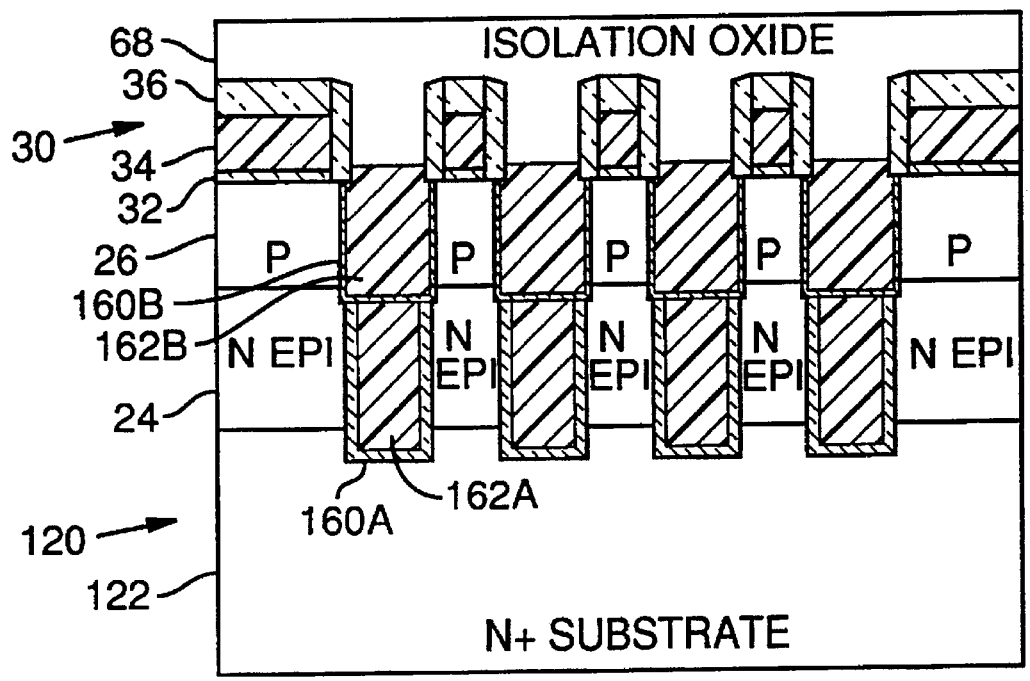

FIG. 18 is a cross-sectional view corresponding to FIG. 7 showing the further steps of etching the polysilicon to a level about the level of the original substrate surface and depositing isolation oxide 68 into the trenches 150B and over the trenching protective structures. These steps are followed by steps like those shown in FIGS. 8–10 above.

Figure 19:
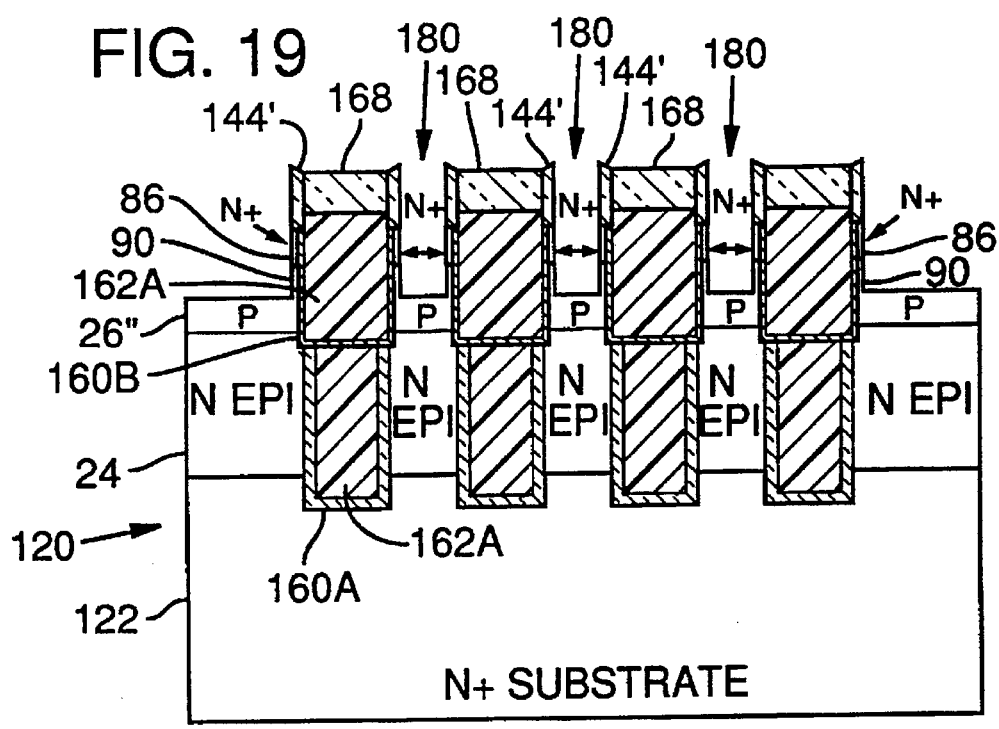
Figure 20:
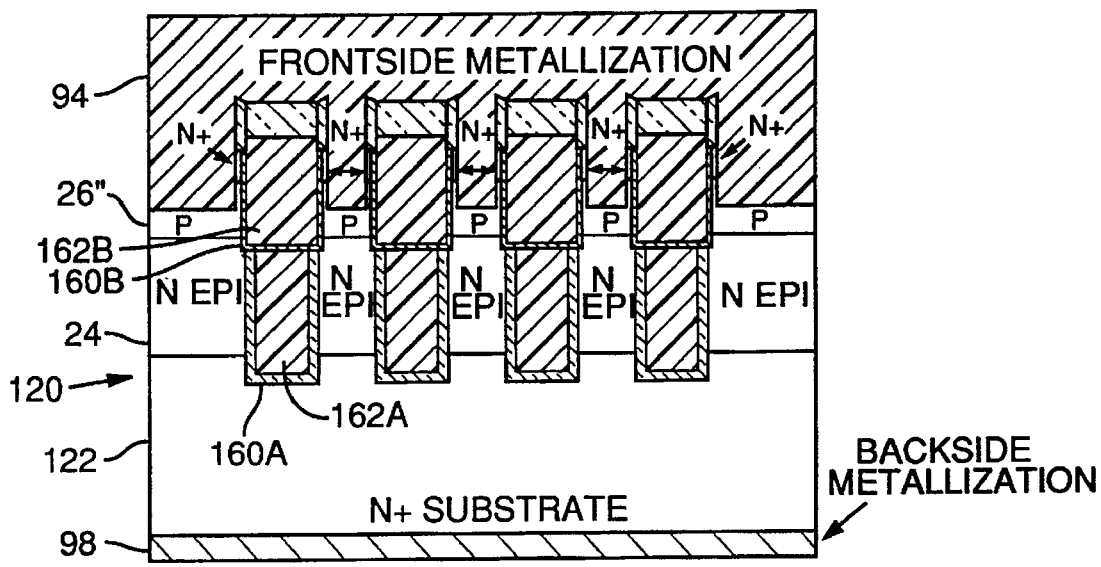

FIGS. 19 and 20 are cross-sectional views corresponding to FIGS. 11 and 12 showing the further steps of forming the second trench and metallization in a device with the double polysilicon gate structure developed in FIGS. 14–18. Trenches 180 are formed in the N+ source regions between the sidewalls 144' and gate isolation oxide plugs 168 enclosing the gate polysilicon material 162B and gate oxide layers 160B. The N+ region is reduced to vertically oriented N+ source layers 86 having a lateral thickness 88 atop vertical P-type layers 90 as described above at FIG. 11.

The prior art problem of losing breakdown voltage range when the trench depth reaches the substrate is eliminated by the presence of the thicker first gate oxide 160A. The thicker gate oxide layer shifts the gate-drain voltage drop from silicon to oxide. At the same time, the second thinner gate oxide preserves the enhancement mode MOSFET channel conductance. Conductance exceeding the first embodiment and prior art designs can be achieved with minimal additional processing steps.

Figure 21:
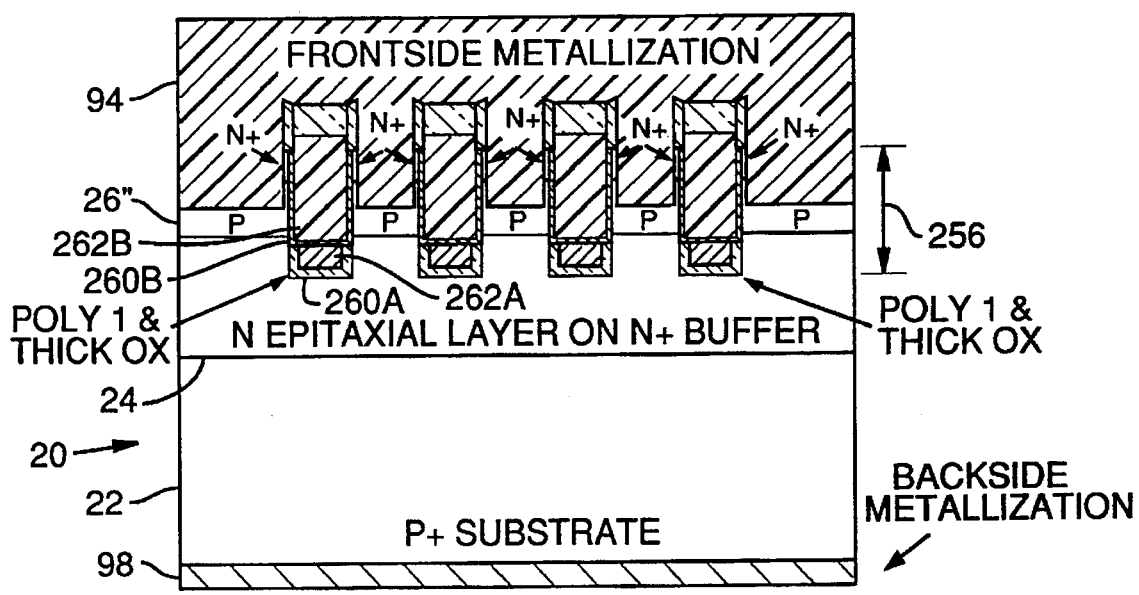
FIG. 21 is a cross-sectional view corresponding to FIGS. 12 and 20 showing fabrication of a device in accordance with a third embodiment of the invention with a double polysilicon gate structure which terminates depthwise within the N-type epitaxial layer above an N+ buffer layer formed on a P+ substrate to operate as an IGBT.

FIG. 21 is a cross-sectional view corresponding to FIGS. 12 and 20 showing a third embodiment of the method of fabrication of a device with a double polysilicon gate structure to provide protection against gate oxide rupture for high voltage devices while thin sidewall oxide preserves channel conductivity. In this example, the double polysilicon gate structure has a first thick oxide layer 260A and polysilicon layer 262A formed in a trench having a depth 256 (e.g., 3 µm) greater than depth 56 of trench 50 but shallower than the depth 156 of trench 150. The trench in this case terminates depthwise in substrate 20 within the N-type epitaxial layer 24 above an N+ buffer formed on a P+ wafer layer 22 to operate as an IGBT or other gate controlled four-layer device. In this embodiment as well as the first embodiment, the narrowest lateral dimension of region 40 (FIG.3) that photolithography can control is used to minimize trench corner field and optimize breakdown voltage.

Figure 22:
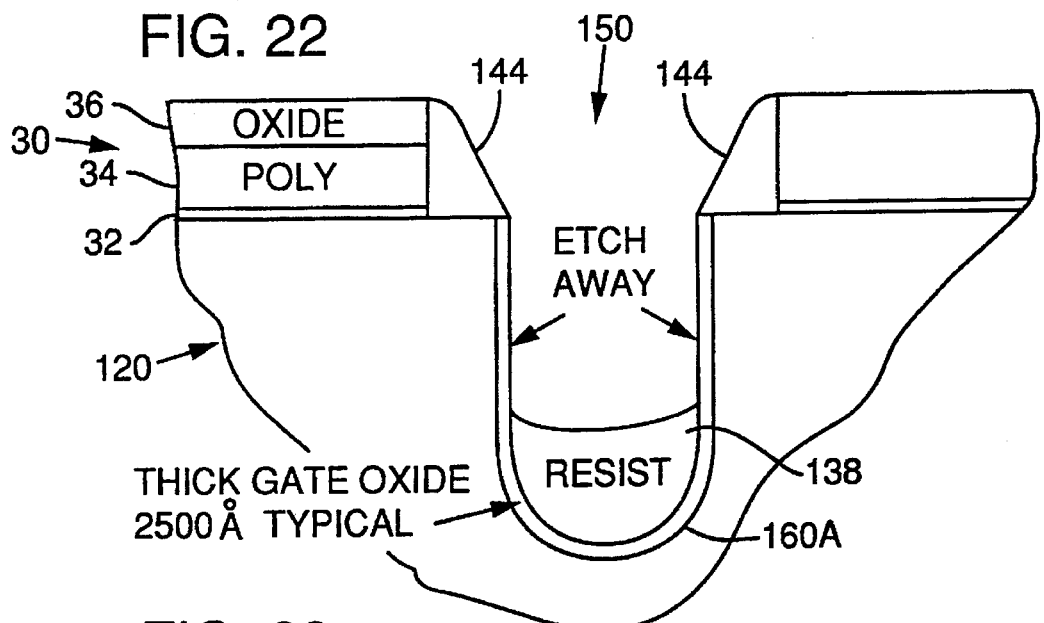
FIGS. 22 and 23 are cross-sectional views corresponding roughly to FIGS. 16 and 17 showing fabrication of a recessed gate field effect power MOS device in accordance with a fourth embodiment of the invention.
Figure 23:
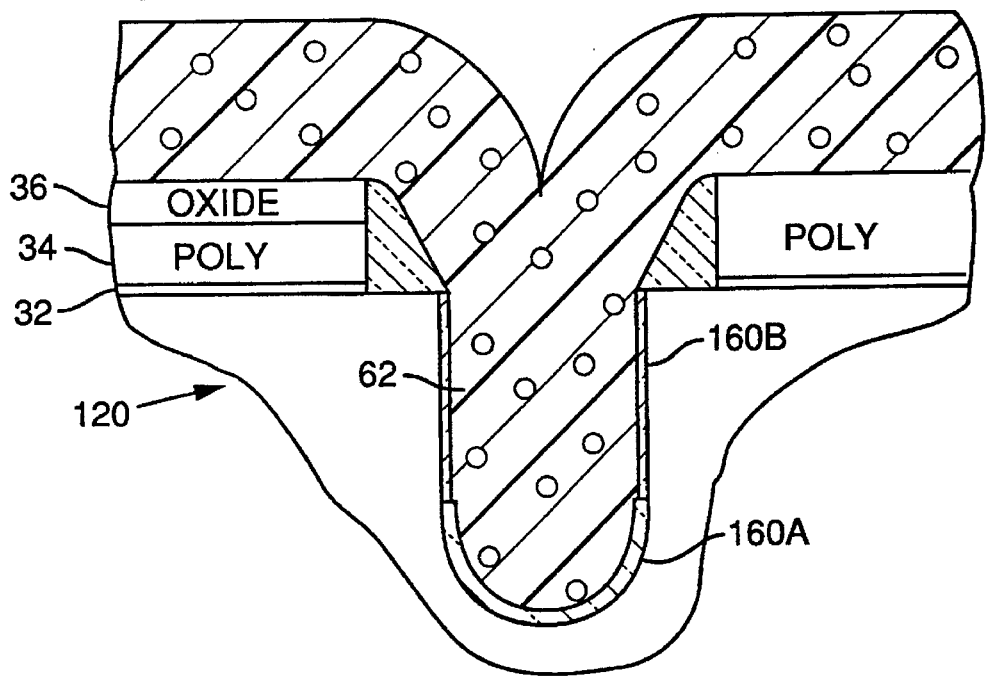

FIGS. 22 and 23 are cross-sectional views corresponding roughly to FIGS. 16 and 17 showing fabrication of a recessed gate field effect power MOS device in accordance with a fourth embodiment of the invention. In this embodiment, as in the second and third, an initial thick (~2500 Å) layer 160A of thermal oxide is formed on the sidewalls and bottom wall of trench 150. Then, rather than using filled and etched-back polysilicon, photoresist 138 is pooled in the bottom of the trench 150 and, when hardened, is used to protect the initial thick oxide layer in the lower portion of the trench while the sidewall portions of layer 160A are etched away. Next, after using known solvents to strip the photoresist 138, gate oxide 160B is regrown on the trench sidewalls above oxide 160A to a suitable thickness (~500–1000 Å) as previously described at FIG. 17. Then, doped polysilicon gate material 62 is deposited as described above at FIG. 6, and the remainder of the device is completed by the steps shown in FIGS. 18–21. The approach shown in FIGS. 22 and 23 is simpler than the double polysilicon structure of FIGS. 14–17, and accomplishes essentially the same result.

FIG. 24 is a cross-sectional view corresponding to FIG. 3 showing an alternative form of the mask surrogate pattern definition layer 330. The protective layer 330 has, atop initial oxide layer 32, a polysilicon multi-layer structure preferably including two polysilicon layers with an intermediate etchstop oxide layer. In this embodiment, the lower polysilicon layer 334 is thicker (e.g., 15000–16000 Å) than layer 34, the intermediate etch-stop oxide layer 336 is thinner (e.g., 1000–2000 Å) than layer 36 and is covered by a polysilicon layer 338 of about 5000 Å. The top polysilicon layer 338 is a sacrificial layer to be removed when trench 50 is formed, using oxide layer 336 as an etch stop. The top surface of lower polysilicon layer 334 indicates an endpoint for the etching of the isolation oxide layer (FIGS. 7 and 8) to produce plugs 68. The thickness of polysilicon layer 334 determines the height down to which plug 68 is etched. Layer 334 is removed using oxide layer 32 for etching end point detection, and then layer 32 is removed prior to N+ implantation and the second trenching step.

Figure 25:
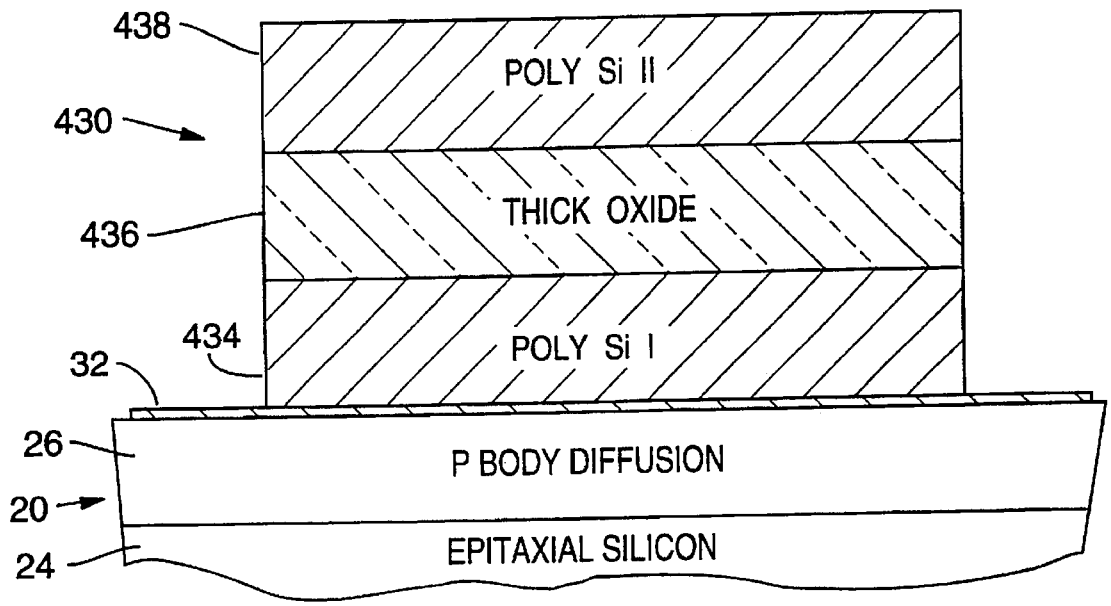
FIG. 25 is a cross-sectional view of a variation in the mask surrogate layer of FIG. 24 with a thick intermediate oxide layer.

FIG. 25 is a cross-sectional view showing a modification in the above-described process commencing at a stage equivalent to that of FIG. 2 with a variation of the substrate of FIG. 24. In this variation, the mask surrogate pattern definition layer 430 has a thicker intermediate oxide layer 436 sandwiched between lower polysilicon layer 434 (deposited atop detection oxide layer 32) and upper polysilicon layer 438. Endpoint detection oxide layer 36 and lower polysilicon layer 434 have the same thicknesses as layers 36 and 334 in FIG. 24. The oxide layer 436 has a range of thickness greater than that of layer 336, from 1000 Å to 20000 Å. The upper polysilicon layer 438 is also thicker, from 5000 Å to 16000 Å.

By way of example, suitable thicknesses for each of layers 434, 436 and 438 are shown in a range of 15000 Å to 16000 Å. Polysilicon layer 438 must be thick enough to withstand the etching of oxide layer 436. Similarly, layer 436 must be thick enough to withstand all subsequent polysilicon and wet oxide etches, to protect layer 434, until removal (see FIG. 8). These thicknesses can be varied, however, depending on Si/SiO$_2$ selectivity of the various etches. For etchants that are highly selective between silicon and oxide, these layers can be thinner than the exemplary thicknesses.

Figure 26:
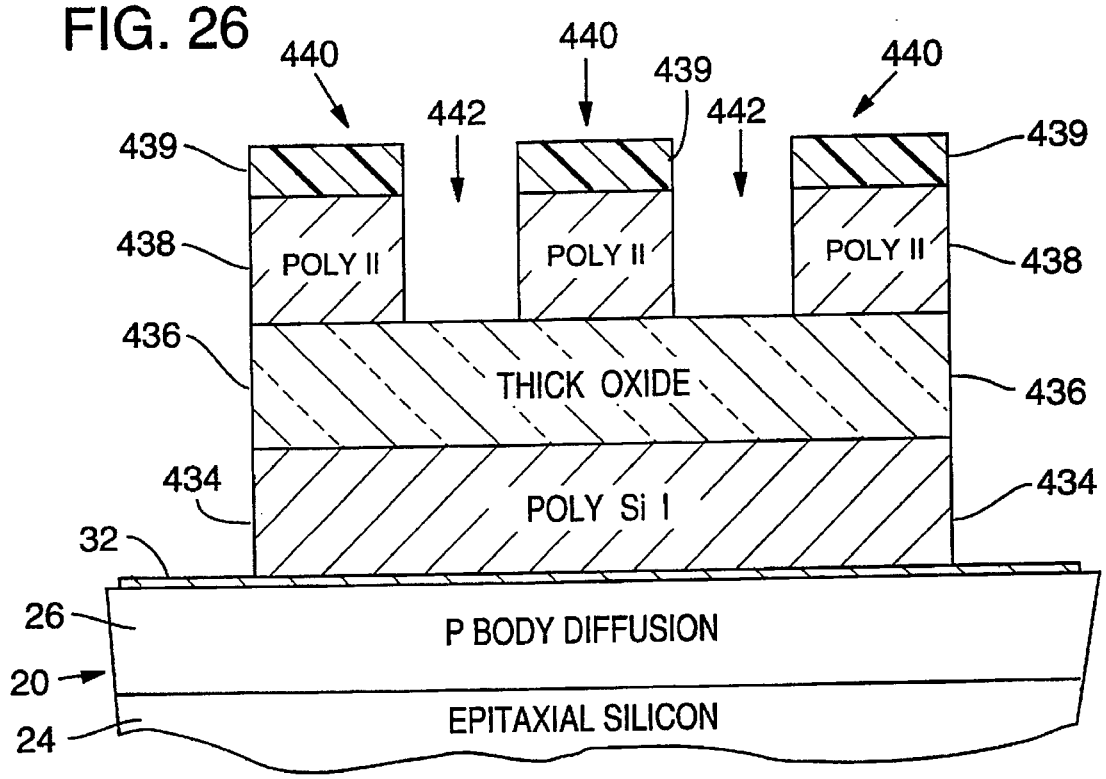
Figure 27:
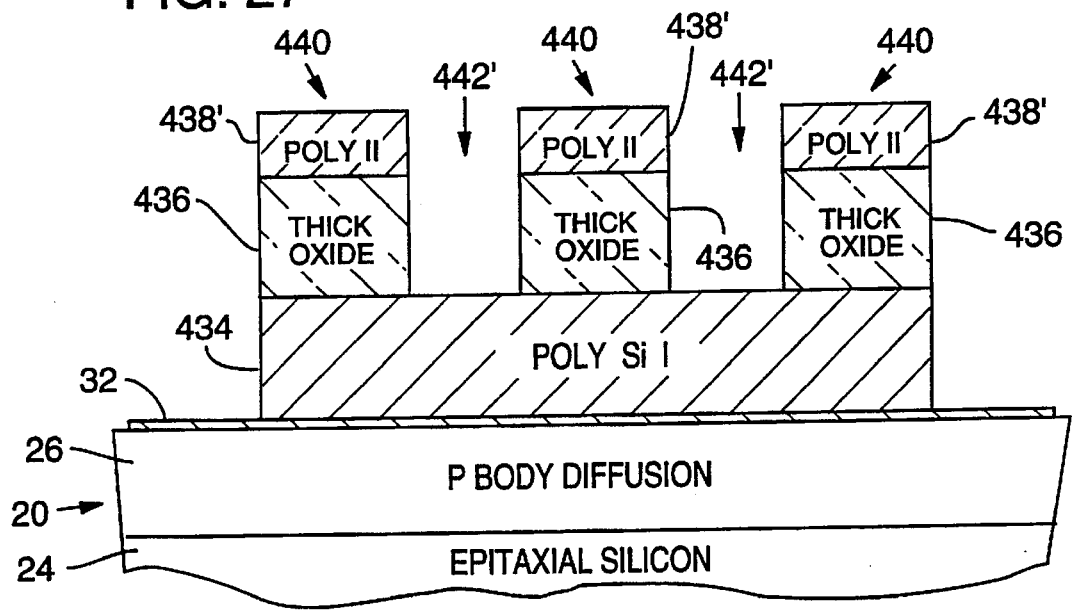
Figure 28:
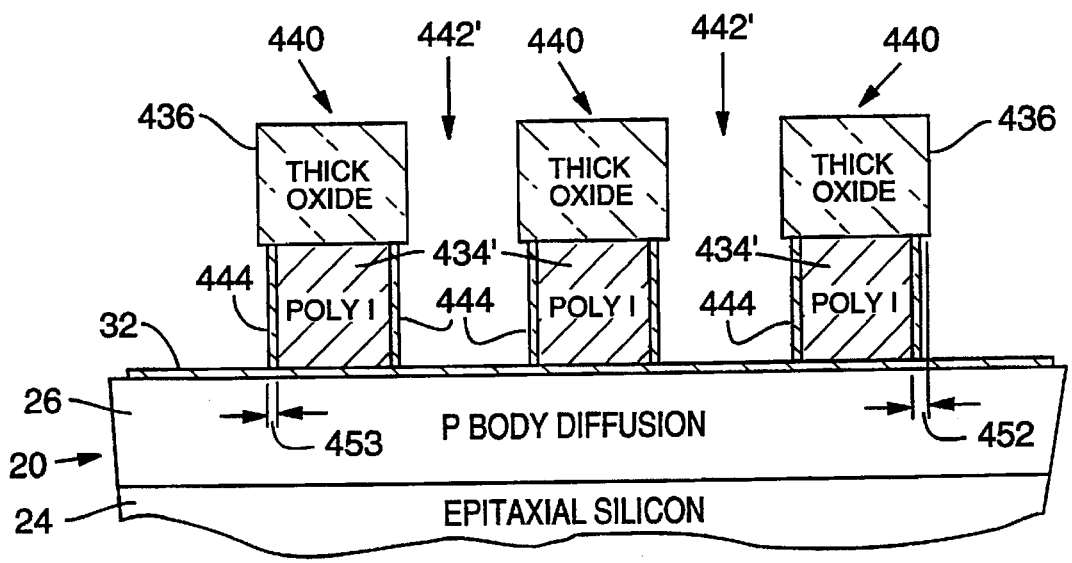

FIGS. 26–28 show a series of steps in which the wafer is processed to a stage roughly similar to that of FIG. 3. First, a photoresist layer 439 is deposited and patterned to define protected regions 440 in layer 438. Polysilicon layer 438 is then etch down to oxide layer 436 to form incipient channel regions 442. The general arrangement of protected regions 440 and 442 is like that of regions 40 and 42 in FIG. 3.

Next, FIG. 27 shows the steps of stripping the photoresist 439 and anisotropically etching through the thick oxide layer 436. This etching step extends the depth of the incipient channel regions 442 to expose the upper surface of the lower polysilicon layer 434. At the same time, upper polysilicon layer 438' is reduced in thickness, or may be removed altogether.

Finally, FIG. 28 shows a silicon etching step in which polysilicon layer 434 is etched with a controlled undercut, and then the exposed polysilicon surfaces are thermally oxidized. This etching step deepens channel regions to form channels 442" extending depthwise all the way through to the endpoint detection oxide layer 32. This step also laterally separates the polysilicon layer into spaced regions 434'. If layer 438' was not fully removed in the etching step of FIG. 27, such removal is completed in this step. The thermal oxidation step forms oxide sidewalls 444 on the vertical sides of the polysilicon regions 434'. The foregoing series of steps leaves a set of patterned regions 440, 442" similar to regions 40, 42 in FIG. 3, but with an oxide layer 436 thicker than layer 36 and, most significantly, undercut oxide sidewalls 444 on the polysilicon regions. The lateral dimension 452 of the undercut at this stage is similar to the thickness of sidewall spacers 44 (See FIG. 4), i.e., 0.5 to 1 micrometer. The thickness 453 of the thermal oxide sidewall 444 can vary from 1000 Å to 5000 Å, preferably about 3000 Å.

The preceding steps bring the process to a stage roughly equivalent to that shown in FIG. 3. The next step, shown in FIG. 29, is an anisotropic oxide etch. Similarly to the corresponding step shown in FIG. 4, this step exposes areas 446 of the underlying silicon layer 26. It also gives the combined structure of the polysilicon regions 434', oxide sidewalls 444 and the remaining portions of oxide layer 32 a microscopically perceptible I-beam shape, with short laterally protruding rims 447 having visible edges along both sides of the base of each channel 442". These rims can be easily seen under a high-magnification SEM or optical microscope.

Next, as shown in FIG. 30, a trench 450 is anisotropically etched into the underlying silicon, through layer 26 to a depth 456 into layer 24, as previously described in connection with FIG. 5. In this etching step, the oxide sidewalls 444 help protect the polysilicon regions 434 to serve as pattern definers. Structures 434', 444, 447 in turn serve as a mask for etching the trench to a width 454 substantially equal to the spacing of the structures.

Figure 31:
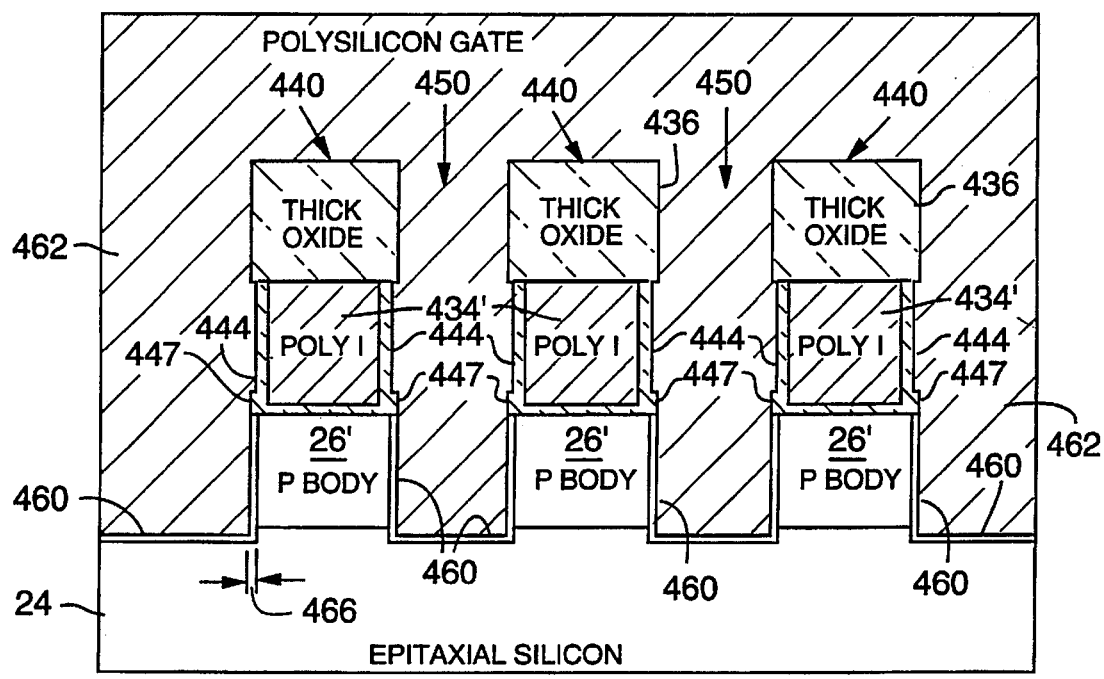

FIG. 31 shows a step equivalent to that shown in FIG. 6. A gate oxide layer 460 is grown on the exposed silicon surfaces along the sides and bottom of the trenches 450. Then, the entire device is filled and covered with polysilicon gate material 462. The gate oxide layer 460 has a thickness 466 similar to the thickness 66 in the process of FIG. 6, and the polysilicon gate material 462 is doped to conductivity similar to gate material 62 in FIG. 6.

Figure 32:
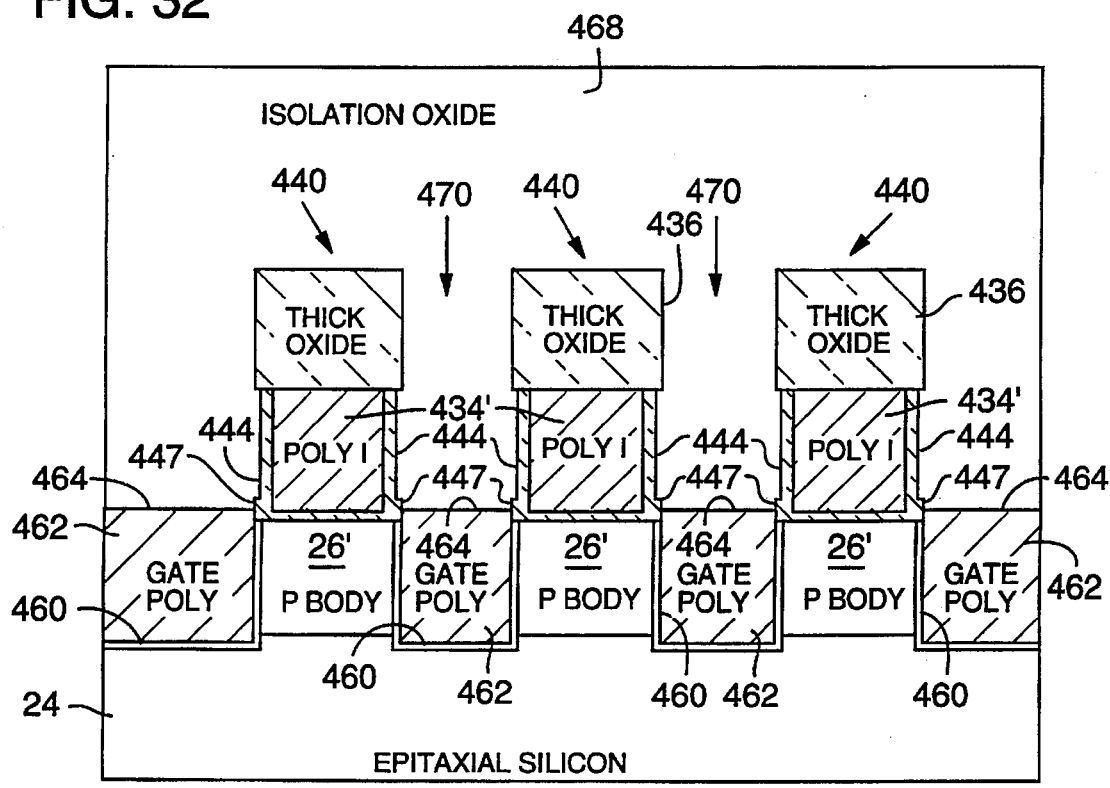

FIG. 32 is generally similar to FIG. 7 in that the gate polysilicon material 462 is etched back to a level 464 near the bottom of the polysilicon regions 434. Then the entire device, including resultant channels 470, is filled and covered with isolation oxide 468. The principle difference lies in the manner of determining the depth to which the gate polysilicon material 462 is etched. In the process described in connection with FIG. 7, using the sidewall spacers does not give any obvious demarcation, necessitating the use of time consuming micromeasurements to ascertain whether the trenching depth is sufficient. In the process of FIGS. 25–32, the I-beam shape is unmistakable. At intervals during etching, the device can be inspected using a scanning electron microscope to see when the edges of the rims 447 become visible above the upper surface 464 of the gate polysilicon material. The rims 447 of the I-beam structure thus serve as markers for determining the endpoint of etching the isolation oxide 468.

The remaining steps of this embodiment of the process closely parallel the steps shown and described in connection with FIGS. 8 through 12, and so need not be repeated. In these subsequent steps, the undercut oxide sidewalls 444 and rims 447 serve the same purpose as the sidewalls 44' as shown in FIG. 11: to define the lateral thickness 88 of the source and body regions 86, 90. The same device structure results as that shown in FIG. 13.

Similarly, the variation in the process shown in FIGS. 25-32 can alternatively be used in combination with the steps shown and described above in connection with FIGS. 14-23.

Having described and illustrated the principles of the invention in a preferred embodiment thereof, it should be apparent that the invention can be modified in arrangement and detail without departing from such principles. For example, it is not necessary to form the second trench and vertical channel structures throughout the device. A portion of the device upper surface could be masked off at appropriate steps (e.g., at FIG. 1 and after FIG. 4) and this portion can be used in the manner described in the commonly-assigned patents to form a double-diffused lateral MOS device on part of the same die as the above-described recessed gate vertical channel device. This variation would be useful in making MOS controlled thyristors (MCT). We claim all modifications and variations coming within the spirit and scope of the following claims.

REFERENCES

1) D. Ueda, H. Takagi, and G. Kano, "A New Vertical Power MOSFET Structure with Extremely Reduced On-Resistance," IEEE Trans. Electron Dev. ED-32, No. 1, pp. 2-6, January 1985.

2) D. Ueda, H. Takagi, and G. Kano, "Deep-Trench Power MOSFET with An Ron Area Product of 160 m$\Omega$-mm$^2$, " IEEE IEDM Tech. Digest, pp. 638-641, 1986.

3) D. Ueda, H. Tagaki, and G. Kano, "An Ultra-Low On-Resistance Power MOSFET Fabricated by Using a Fully Self-Aligned Process," IEEE Trans. Electron Dev. ED-34, No. 4, pp. 926-930, April 1987.

4) H. R. Chang, R. D. Black, V. A. K. Temple, W. Tantraporn, and B. J. Baliga, "Self-Aligned UMOSFET's with a Specific On-Resistance of 1 m$\Omega$-cm$^2$," IEEE Trans. Electron Dev. ED-34, No. 11, pp. 2329-2334, November 1987.

5) H. R. Chang, B. J. Baliga, J. W. Kretchmer, and P. A. Piacente, "Insulated Gate Bipolar Transistor (IGBT) with a Trench Gate Structure," IEEE IEDM Tech. Digest, pp. 674-677, 1987.

6) S. Mukherjee, M. Kim, L. Tsou, and M. Simpson, "TDMOS-An Ultra-Low On-Resistance Power Transistor," IEEE Trans. Electron Dev. ED-35, No. 12, p. 2459, December 1988.

7) C. Bulucea, M. R. Kump, and K. Amberiadis, "Field Distribution and Avalanche Breakdown of Trench MOS Capacitor Operated in Deep Depletion," IEEE Trans. Electron Dev. ED-36, No. 11, pp. 2521-2529, November 1989.

8) K. Shenai, W. Hennessy, M. Ghezzo, D. Korman, H. Chang, V. Temple, and M. Adler, "Optimum Low-Voltage Silicon Power Switches Fabricated Using Scaled Trench MOS Technologies," IEEE IEDM Tech. Digest pp. 793-797, 1991.

9) K. Shenai, "A 55-V, 0.2-m$\Omega$-cm$^2$ Vertical Trench Power MOSFET," IEEE Electron Dev. Lett. EDL-12, No. 3, pp. 108-110, March 1991.

10) U.S. Pat. No. 4,994,871, Feb. 19, 1991, H. R. Chang, et al., "Insulated Gate BiPolar Transistor with Improved Latch-up Current Level and Safe Operating Area."

We claim:

1. A method of making a recessed gate field effect power MOS device, the method comprising:

forming a substrate including a first doped layer of a first dopant polarity defining a drain region and a second doped layer of a second dopant polarity opposite to the first dopant polarity defining a body region adjoining an upper surface of the substrate over the drain region;

forming a lower oxide layer atop the second doped layer;

forming a trenching protective layer including a lower polysilicon layer on the lower oxide layer, an intermediate oxide layer, and an upper polysilicon layer on the intermediate oxide layer;

masking and patterning the trenching protective layer to define an exposed first area and a protected second area of the lower oxide layer on the upper surface of the substrate demarcated by opposite sides of the trenching protective layer in which opposite sides of the lower polysilicon layer and upwardly adjacent sides of the intermediate oxide layer are exposed;

forming undercut oxide sidewalls having inner surfaces contacting the sides of the lower polysilicon layer of the trenching protective layer and outer surfaces spaced from the sides of the lower polysilicon layer to define a thickness of the undercut oxide sidewalls, the sides of the lower polysilicon layer being spaced inward from the upwardly adjacent sides of the intermediate oxide layer by a spacing greater than the thickness of the undercut oxide sidewalls;

etching through the lower oxide layer to expose the upper surface of the substrate in the exposed first area and to form a pair of opposed rims along an intersection of each of the undercut oxide sidewalls and the lower oxide layer, each rim protruding laterally from the outer surface of the undercut oxide sidewall above the upper surface of the substrate;

forming in the upper surface of the substrate, between the opposed rims first trench having sidewalls aligned relative to the outer edges of the opposed rims and extending at least through the second layer defining the body region to a bottom wall spaced to a depth from the upper surface of the substrate;

forming a gate oxide layer on each of the sidewalls of the first trench;

filling the first trench with polysilicon to a level adjoining the opposed rims;

applying a protective layer over the polysilicon filled into the first trench, between the undercut oxide sidewalls and in contact with the outer surfaces of the undercut oxide sidewalls;

removing the trenching protective layer and the lower oxide layer in the protected second area to expose a second area of the upper surface of the substrate between the inner surfaces of the undercut sidewalls;

doping the second area of the upper surface of the substrate adjoining the gate oxide layer on each of the sidewalls of the first trench with dopant of said second dopant polarity to form a source region atop the body region;

forming, in the second area of the substrate spaced from the inner surfaces of the undercut oxide sidewalls, a second trench having sidewalls spaced from the inner surfaces of the undercut oxide sidewalls and extending through the source region to a bottom wall in the body region; and depositing a source conductive layer in the second trench in contact with the source region and the body region;

the second trench through the source region and the body region defining vertically-oriented source and body layers stacked along the gate oxide layer on opposite sidewalls of the second trench and having a lateral thickness established by the spacing of the inner and outer surfaces of the undercut oxide sidewalls and rims.

2. A method according to claim 1 in which the vertically-oriented body layer is sized to the lateral thickness less than a vertical height thereof.

3. A method according to claim 1 in which the vertically-oriented body layer is sized to the lateral thickness less than 1 μm.

4. A method according to claim 1 in which the vertically-oriented body layer is doped to a first doping concentration and a laterally-extending portion of the body region below the second trench is doped to a second doping concentration greater than the first doping concentration.

5. A method according to claim 1 including forming an insulative layer between the sidewalls to electrically isolate the polysilicon in the first trench from the source conductive layer.

6. A method according to claim 1 in which the second trench is formed to a depth such that the source conductive layer extends vertically along both the source and body layers to form a short across a PN junction formed between the source and body layers and contacts a laterally-extending upper surface of the body region at a position spaced below the PN junction.

7. A method according to claim 1 in which the substrate includes a base layer underlying the first doped layer and doped with a dopant of said first polarity to a doping concentration greater than a doping concentration of the first doped layer to form a three-layer power MOSFET.

8. A method according to claim 7 in which the first trench is formed to a depth extending into the base layer and the gate oxide layer is formed in a first portion having a first thickness in a lower portion of the first trench and a second portion having a second thickness in an upper portion of the first trench, the first thickness being greater than the second thickness.

9. A method according to claim 1 in which the substrate includes a base layer underlying the first doped layer and doped with a dopant of said second polarity to define a four-layer PNPN device.

10. A method according to claim 9 in which the first trench is formed to a depth within the first doped layer spaced above the base layer and the gate oxide layer is formed in a first portion having a first thickness in a lower portion of the first trench and a second portion having a second thickness in an upper portion of the first trench, the first thickness being greater than the second thickness.

11. A method according to claim 1 in which:
the first trench is formed to a first depth;
a first gate oxide layer is formed with a first thickness;
a filler material is filled into the first trench to a second depth less than the first depth;

a portion of the first gate oxide layer is removed above the filler material;
a second gate oxide layer is formed with a second thickness; and
the first trench is filled above said second depth with a conductive gate material.

12. A method according to claim 11 in which the filler material includes polysilicon and the second gate oxide layer is formed over the polysilicon.

13. A method according to claim 11 in which the filler material includes photoresist and the photoresist is removed before the second gate oxide layer is formed.

14. A method according to claim 1 in which the first trench and the gate oxide layer and polysilicon filled in the first trench define a gate structure which is laterally patterned in two dimensions to define an interconnected matrix enclosing a plurality of islands, each island being formed with said second trench extending into a central portion thereof and containing a downward extending finger of source conductor surrounded by a portion of the source and body layers including a vertical channel having a width defined in each island by a perimeter of the island.

15. A method according to claim 1 in which the body layer is sized to a lateral thickness proportionate to the between the inner surfaces of the undercut oxide sidewalls and the edges of the rims.

16. A method according to claim 1 including forming at least two of said first trenches at a lateral spacing and forming said second trench between the first trenches at a spacing therefrom determined by said spacing of the undercut oxide sidewalls, the first trenches each containing the gate oxide layer and gate conductor, the source conductor extending into the second trench and contacting the vertically-oriented source and body layers, on opposite sides thereof.

17. A method according to claim 1, used to form one of a power MOSFET, an insulated gate bipolar transistor and a MOS controlled thyristor.

18. A method of making a recessed gate field effect power MOS device, the method comprising:

forming a substrate including first and second doped layers of first and second opposite dopant polarities to define a body region adjoining an upper surface of the substrate and an underlying drain region, and a lower oxide layer atop the second doped layer;

forming a trenching protective layer on the upper surface of the substrate, including a lower polysilicon layer on the oxide layer and an intermediate oxide layer;

masking and patterning the trenching protective layer to define an exposed first area and a protected second area of the upper surface of the substrate;

forming oxide sidewalls having inner surfaces contacting opposite sides of the lower polysilicon layer and spaced inward a from the sides of the trenching protective layer;

etching through the lower oxide layer to expose an upper surface of the substrate in the exposed first area along a boundary substantially to aligned with opposite sides of the intermediate oxide layer of the trenching protective layer, said boundary being demarcated along an intersection of outer edge surfaces of the oxide sidewalls with upper surface of the substrate at a spacing from inner surfaces of the oxide sidewalls proportional to said;

forming in the exposed first area of the substrate, between the outer edge surfaces of the oxide sidewalls, a first trench having trench sidewalls aligned relative to the outer edge surfaces of the oxide sidewalls and extending at least through the Second layer to a bottom wall at least a depth from the upper surface of the substrate sufficient to form a separate body region;

forming a gate oxide layer on the first trench sidewalls in contact with the body region;

forming a gate electrode in the first trench in contact with the gate oxide layer;

applying a protective layer selectively over the gate electrode in the first trench;

removing the trenching protective layer to expose the second area of the upper surface of the substrate between the inner surfaces of the oxide sidewalls;

doping the second area of the upper surface of the substrate between the gate oxide layer on the trench sidewalls with dopant of said second dopant polarity to form a source region atop the separate body region;

forming, in the second area between the inner surfaces of the sidewall, a second trench having sidewalls spaced from the inner surfaces of the oxide sidewalls and extending through the source region to a bottom wall in the body region of the substrate; and depositing a source conductive layer in the second trench in contact with the source region and the body region;

the second trench through the source region and the body region defining vertically-oriented source and body layers defining a PN junction stacked along the gate oxide layer on opposite sidewalls of the second trench, the vertically-oriented source and body layers having a lateral thickness established by said spacing of the inner and outer surfaces of the sidewalls;

the oxide sidewalls being formed by under cut etching and thermally oxidizing opposite sides of the lower polysilicon layer beneath the intermediate oxide layer to form sidewalls on opposite sides of the lower polysilicon layer, the oxide sidewalls having a lateral thickness measured from the inner surface thereof defining said spacing.

19. A method according to claim 18, used to form one of a power MOSFET, an insulated gate bipolar transistor and a MOS controlled thyristor.

20. A method according to claim 18 in which the vertically-oriented body layer is sized to the lateral thickness less than a vertical height thereof.

21. A method according to claim 18 in which the body layer is sized to the lateral thickness less than 1 μm.

22. A method according to claim 18 in which the vertically-oriented body layer is doped to a first doping concentration and a laterally-extending portion of the body region below the second trench is doped to a second doping concentration greater than the first doping concentration.

23. A method according to claim 18 including forming an insulative layer between the sidewalls to electrically isolate the polysilicon in the first trench from the source conductive layer.

24. A method according to claim 18 in which the second trench is formed to a depth such that the source conductive lay extends vertically along both the source and body layers to form a short across a PN junction formed between the source and body layers and contacts a laterally-extending upper surface of the body region at a position spaced below the PN junction.

25. A method according to claim 18 in which the substrate includes a base layer underlying the first doped layer and doped with a dopant of said first polarity to a doping concentration greater than a doping concentration of the first doped layer to form a three-layer power MOSFET.

26. A method according to claim 25 in which the first trench is formed to a depth extending into the base layer and the gate oxide layer is formed in a first portion having a first thickness in a lower portion of the first trench and a second portion having a second thickness in an upper portion of the first trench, the first thickness being greater than the second thickness.

27. A method according to claim 18 in which the substrate includes a base layer underlying the first doped layer and doped with a dopant of said second polarity to define a four-layer PNPN device.

28. A method according to claim 27 in which the first trench is formed to a depth within the first doped layer spaced above the base layer and the gate oxide layer is formed in a first portion having a first thickness in a lower portion of the first trench and a second portion having a second thickness in an upper portion of the first trench, the first thickness being greater than the second thickness.

29. A method according to claim 18 in which:

the first trench is formed to a first depth;

a first gate oxide layer is formed with a first thickness;

a filler material is filled into the first trench to a second depth less than the first depth;

a portion of the first gate oxide layer is removed above the filler material;

a second gate oxide layer is formed with a second thickness; and the first trench is filled above said second depth with a conductive gate material.

30. A method according to claim 29 in which the filler material includes polysilicon and the second gate oxide layer is formed over the polysilicon.

31. A method according to claim 29 in which the filler material includes photoresist and the photoresist is removed before the second gate oxide layer is formed.

32. A method according to claim 18 in which the first trench and the gate oxide layer and polysilicon filled in the first trench define a gate structure which is laterally patterned in two dimensions to define an interconnected matrix enclosing a plurality of islands, each island being formed with said second trench extending into a central portion thereof and containing a downward extending finger of source conductor surrounded by a portion of the source and body layers including a vertical channel having a width defined in each island by a perimeter of the island.

33. A method according to claim 18 in which the body layer is sized to a lateral thickness proportionate to the spacing between the inner surfaces of the undercut oxide sidewalls.

34. A method according to claim 18 including forming at least two of said first trenches at a lateral spacing and forming said second trench between the first trenches at a spacing therefrom determined by said spacing of the undercut oxide sidewalls, the first trenches each containing the gate oxide layer and gate conductor, the source conductor extending into the second trench and contacting the vertically-oriented source and body layers on opposite sides thereof.

* * * * *

UNITED STATES PATENT AND TRADEMARK OFFICE
CERTIFICATE OF CORRECTION

PATENT NO. : 5,648,283
DATED : July 15, 1997
INVENTOR(S) : Tsang et al.

It is certified that error appears in the above-identified patent and that said Letters Patent is hereby corrected as shown below:

Column 16, line 24, "the between" should read --the spacing between--;
Column 16, line 55, "a from" should read --a spacing from--;
Column 16, line 65, "said;" should read --said spacing;--;

Signed and Sealed this

Eighth Day of September, 1998

Attest:

BRUCE LEHMAN

Attesting Officer           Commissioner of Patents and Trademarks

UNITED STATES PATENT AND TRADEMARK OFFICE
CERTIFICATE OF CORRECTION

PATENT NO.    : 5,648,283
DATED         : July 15, 1997
INVENTOR(S)   : Tsang et al.

It is certified that error appears in the above-identified patent and that said Letters Patent is hereby corrected as shown below:

Column 15,
Line 1, "second" should read -- first --

Column 16,
Line 59, "substantially to aligned" should read -- substantially aligned --

Column 17,
Line 18, "second" should read -- first --

Signed and Sealed this

Eleventh Day of February, 2003

JAMES E. ROGAN
*Director of the United States Patent and Trademark Office*